(12) United States Patent
Terauchi et al.

(10) Patent No.: US 6,864,546 B2
(45) Date of Patent: Mar. 8, 2005

(54) SEMICONDUCTOR DEVICE HAVING MEMORY CELL PORTION AND MANUFACTURING METHOD THEREOF

(75) Inventors: Takashi Terauchi, Tokyo (JP); Shigeru Shiratake, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/699,890

(22) Filed: Nov. 4, 2003

(65) Prior Publication Data

US 2004/0211981 A1 Oct. 28, 2004

(30) Foreign Application Priority Data

Apr. 22, 2003 (JP) ......................................... 2003-116668

(51) Int. Cl.[7] .............................................. H01L 29/76
(52) U.S. Cl. ...................... 257/384; 257/303; 257/306; 257/310; 257/311
(58) Field of Search ................................. 257/303, 306, 257/310, 311

(56) References Cited

U.S. PATENT DOCUMENTS 6,433,381 B2 * 8/2002 Mizutani et al. ............. 257/311
6,744,091 B1 * 6/2004 Ema et al. ................... 257/303

FOREIGN PATENT DOCUMENTS

JP 3-212974 9/1991
JP 6-216333 8/1994

* cited by examiner

Primary Examiner—David Nelms
Assistant Examiner—Mai-Huong Tran
(74) Attorney, Agent, or Firm—Oblon, Spivak, McClelland, Maier & Neustadt, P.C.

(57) ABSTRACT

A semiconductor device having a memory cell portion and a peripheral circuit portion is provided which achieves suppression of reduction of punch-through margin of transistors in the peripheral circuit portion and offers ensured short margin and enhanced current driving capability. After a high-temperature (800° C. to 1000° C.) thermal treatment that is performed to improve burying characteristics after formation of an interlayer insulating film, and also after a high-temperature (800° C. to 1000° C.) thermal treatment that is performed to enhance refresh characteristics after formation of contact plugs in the memory cell portion, a silicon oxide film and insulating film formed on a semiconductor substrate in the peripheral circuit portion are removed by anisotropic dry-etching, leaving the insulating film as sidewall insulating films on sides of sidewall nitride films. Then an impurity ion implantation process is performed using gate interconnections as implant masks to form source/drain regions in the peripheral circuit portion.

6 Claims, 50 Drawing Sheets

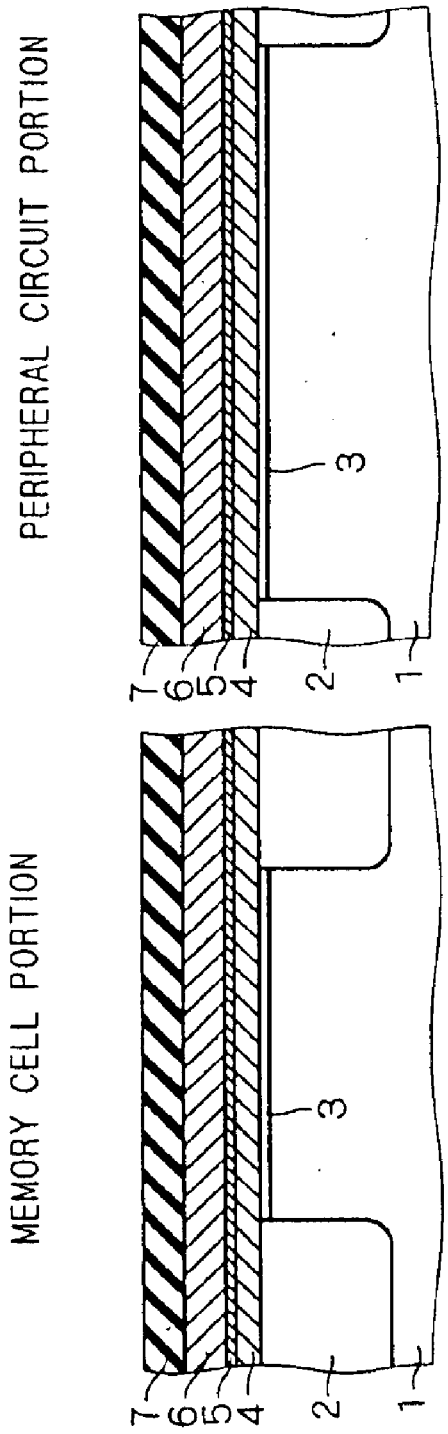

FIG. 7
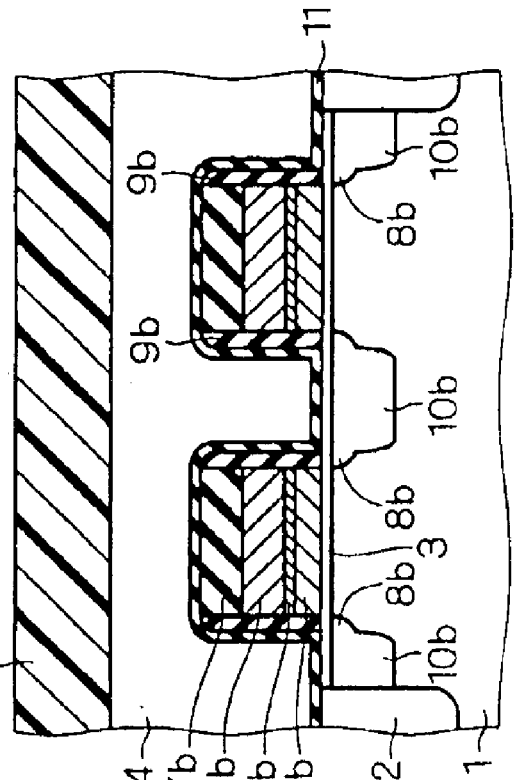
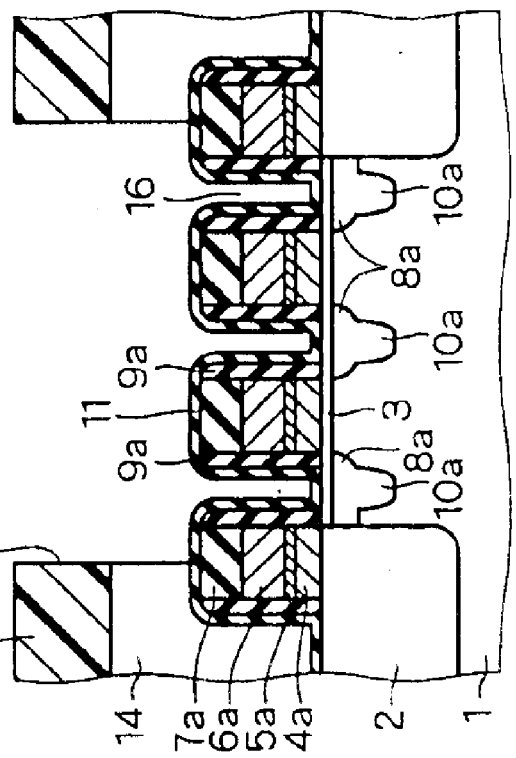

FIG. 11
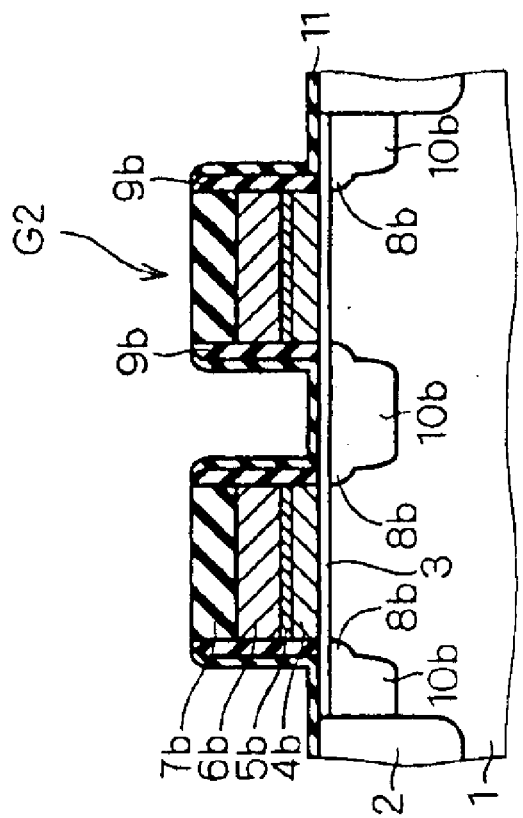
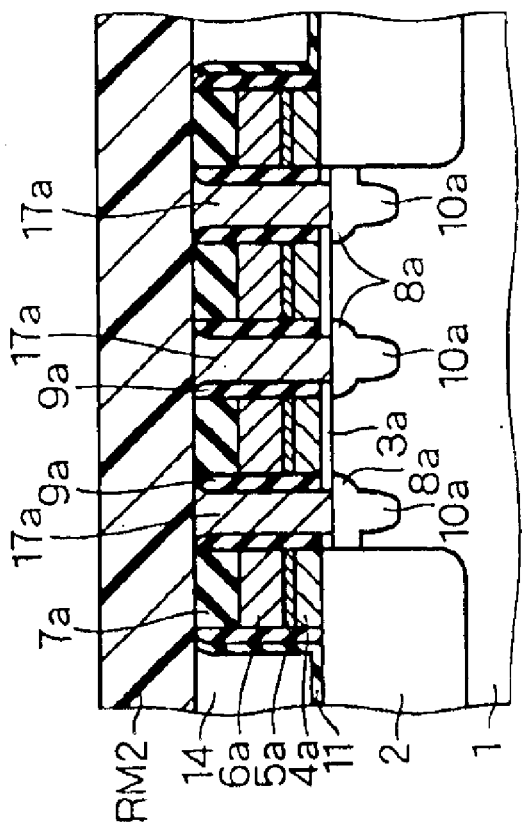

FIG. 14
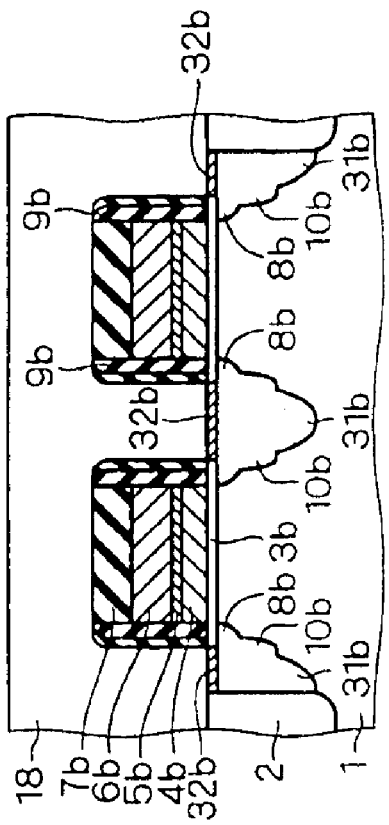
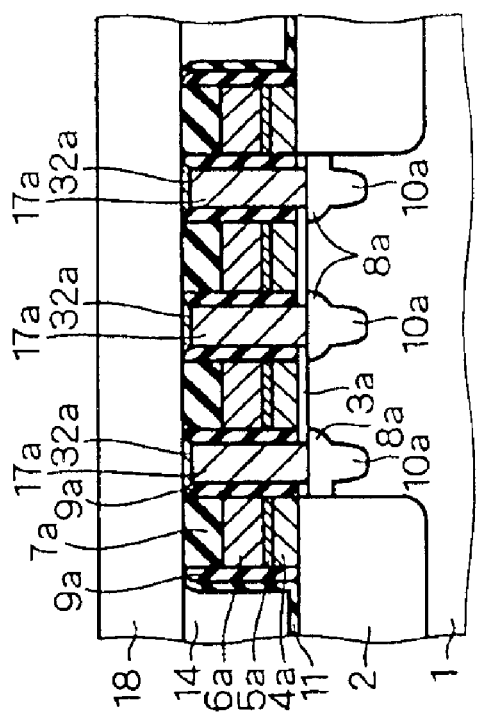

F I G . 1 9
PERIPHERAL CIRCUIT PORTION
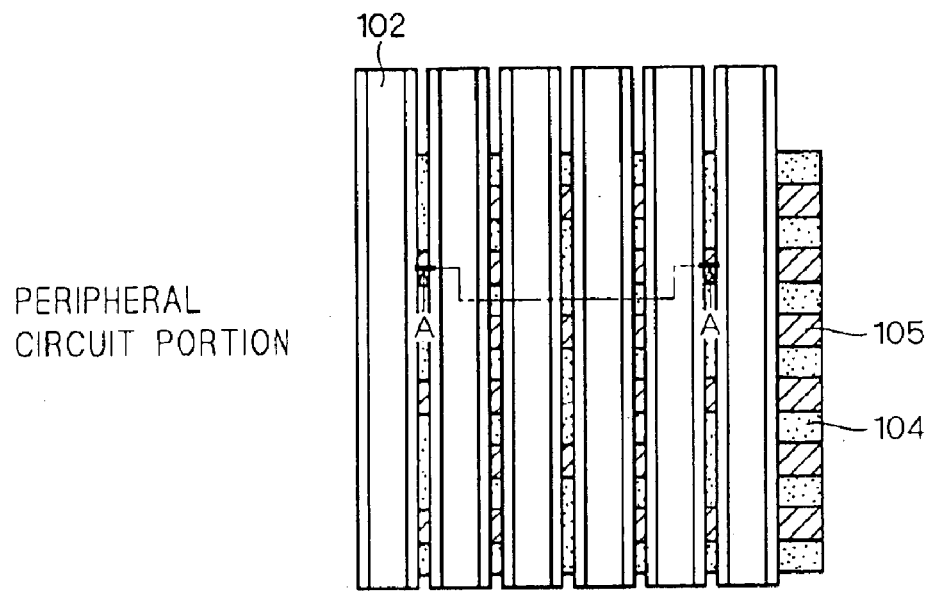
F I G . 2 0
PERIPHERAL CIRCUIT PORTION
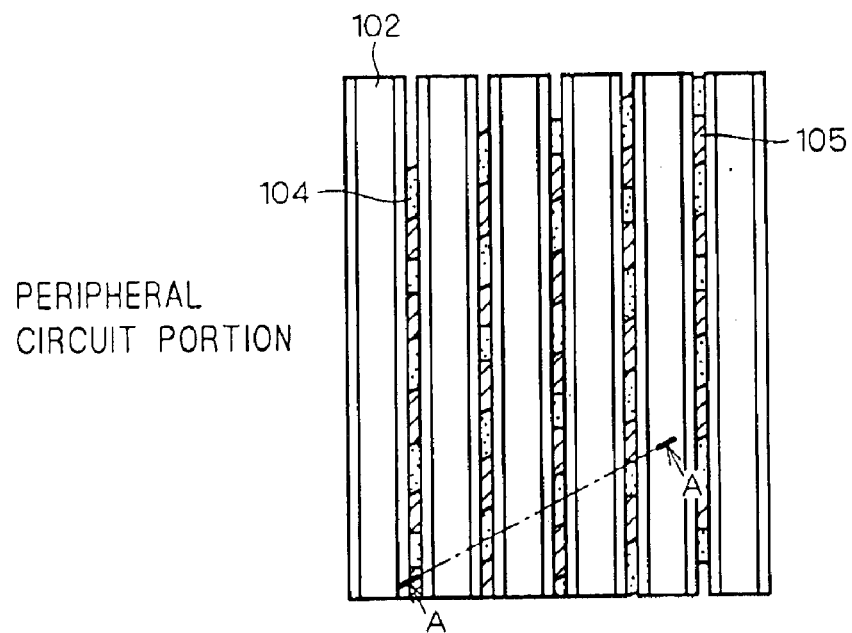

FIG. 33
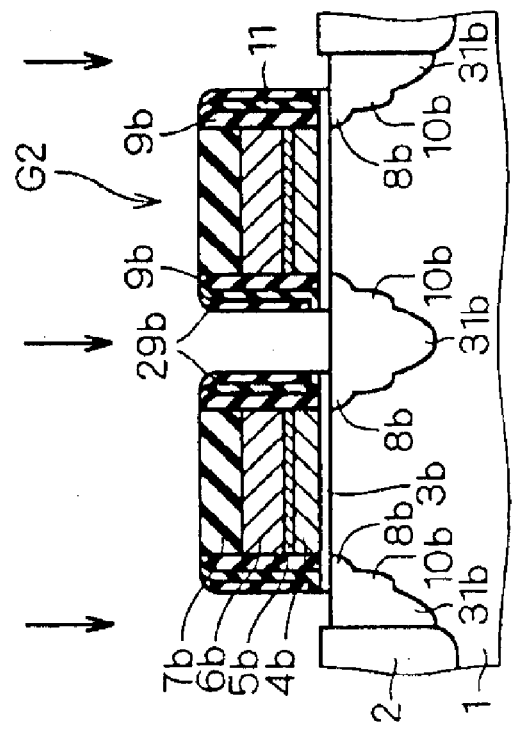
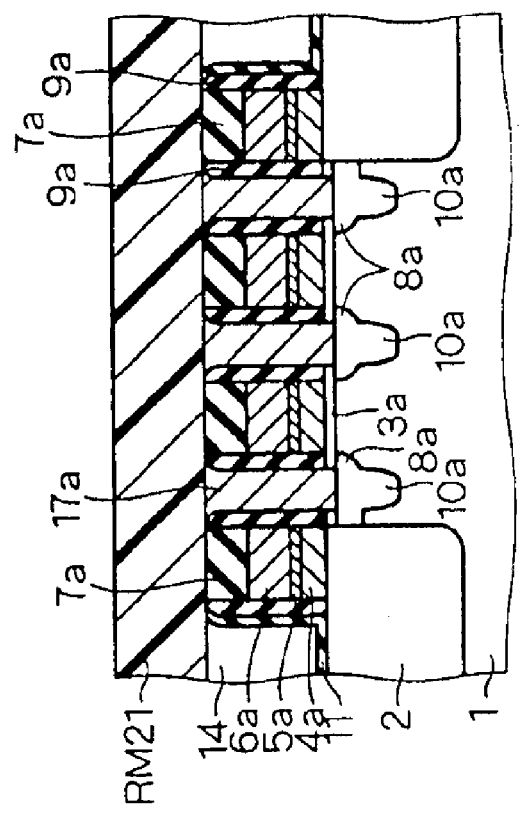

FIG. 34
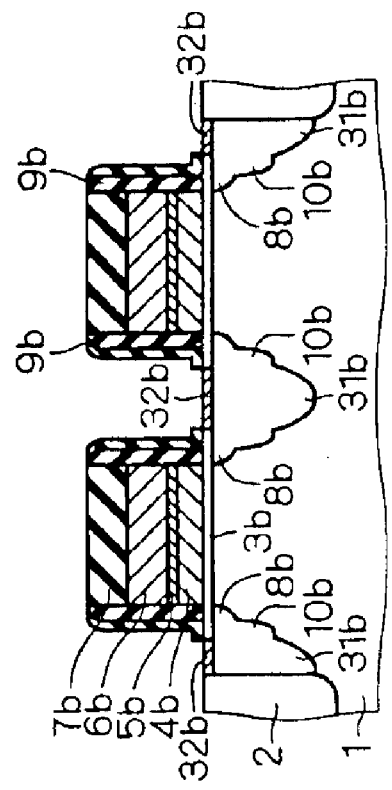
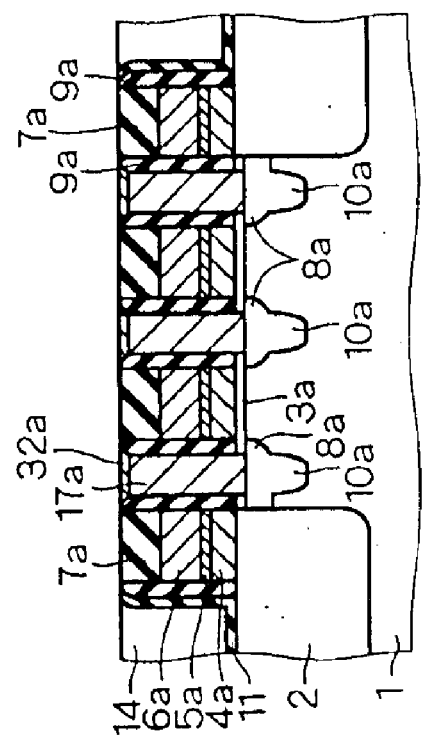

FIG. 36
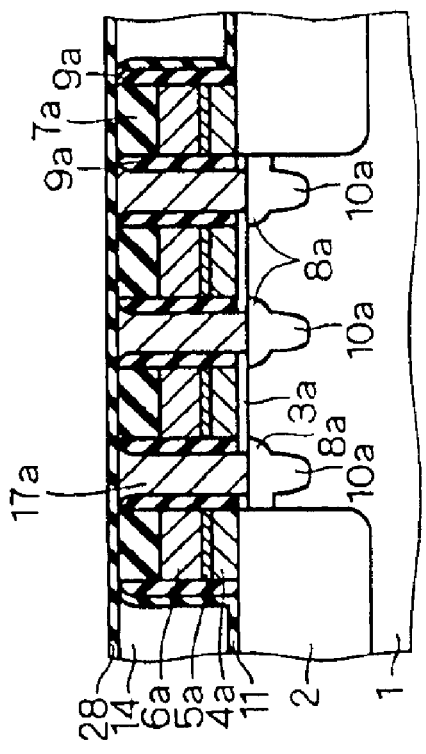
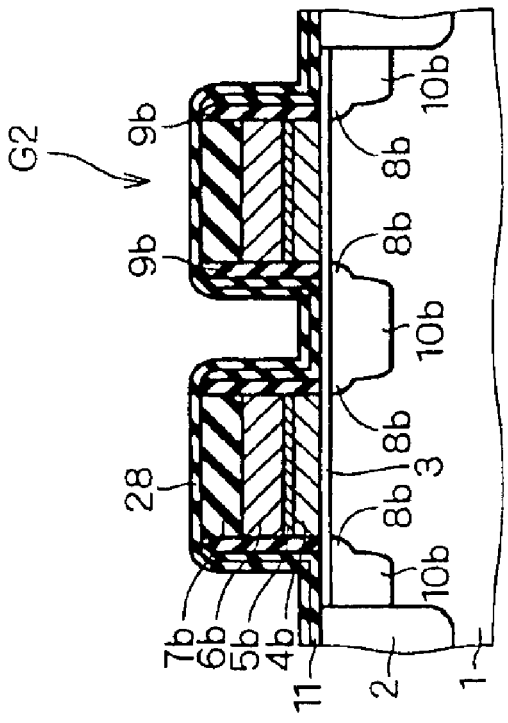

FIG. 41
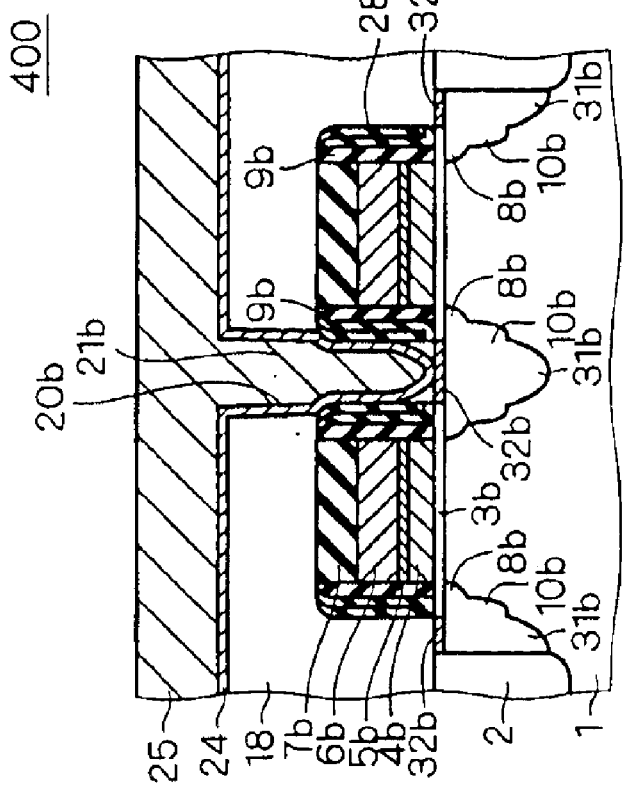
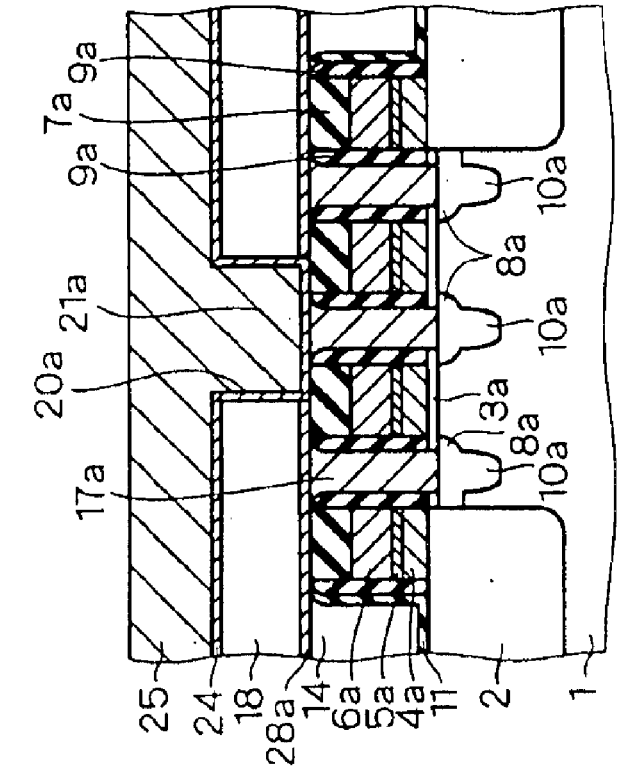

FIG. 42
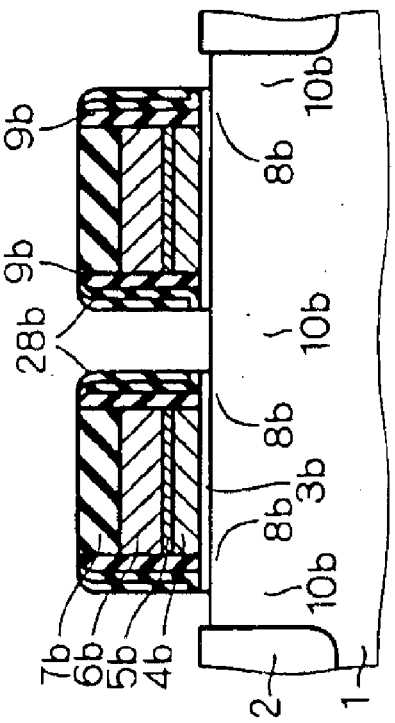
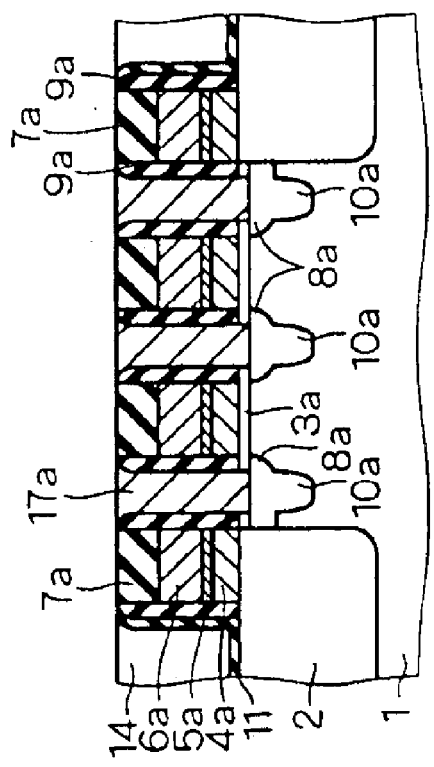

FIG. 44
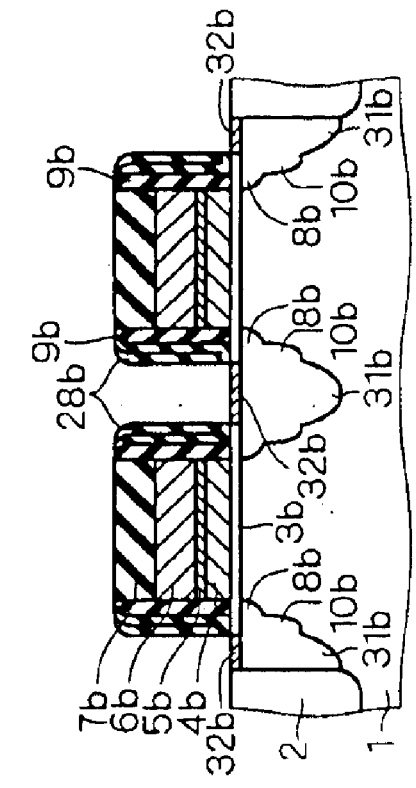
MEMORY CELL PORTION
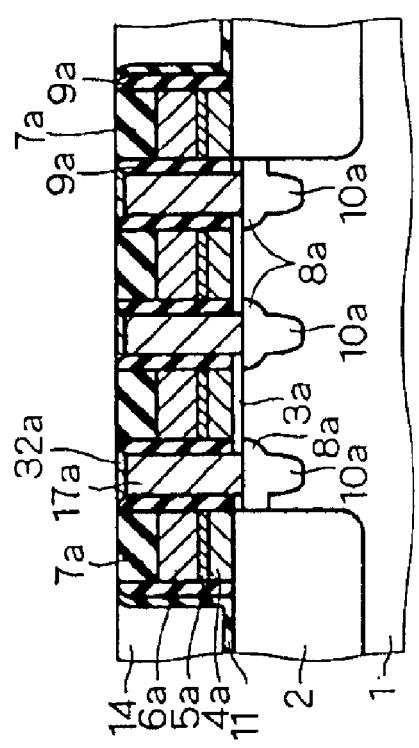
PERIPHERAL CIRCUIT PORTION

FIG. 46
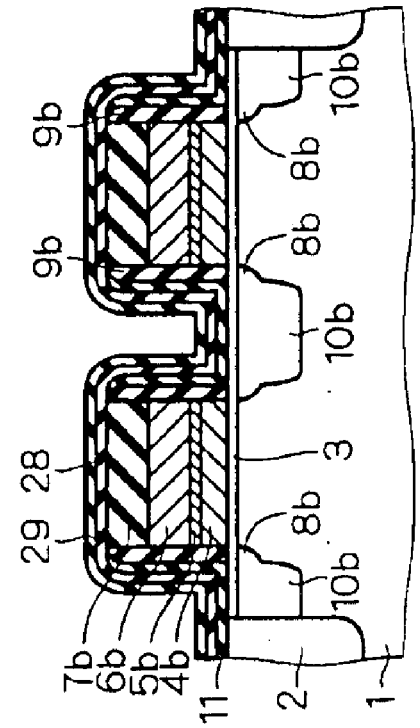
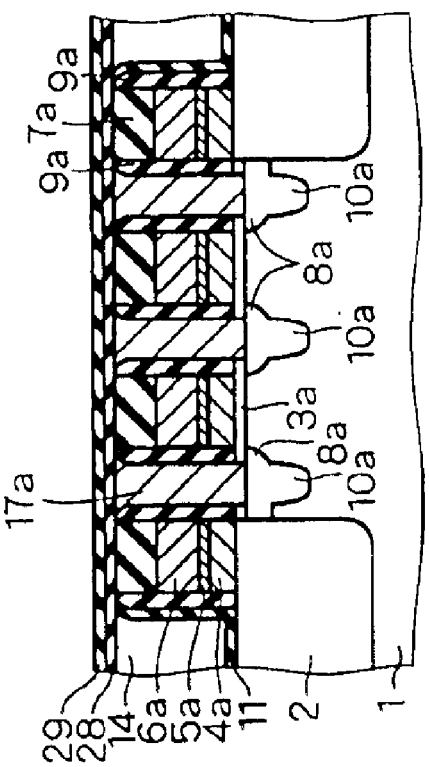

FIG. 48
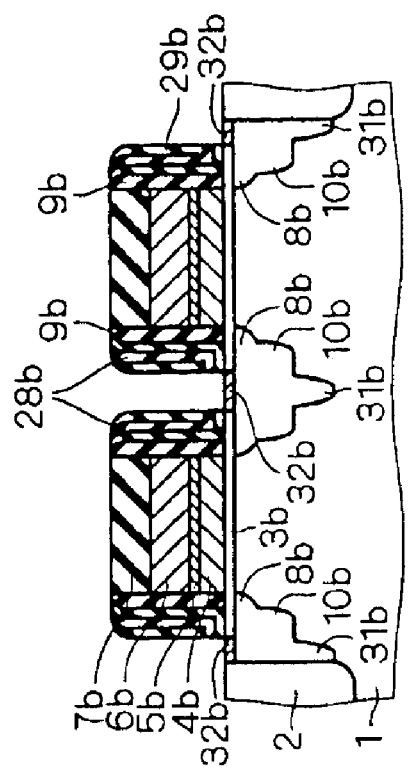
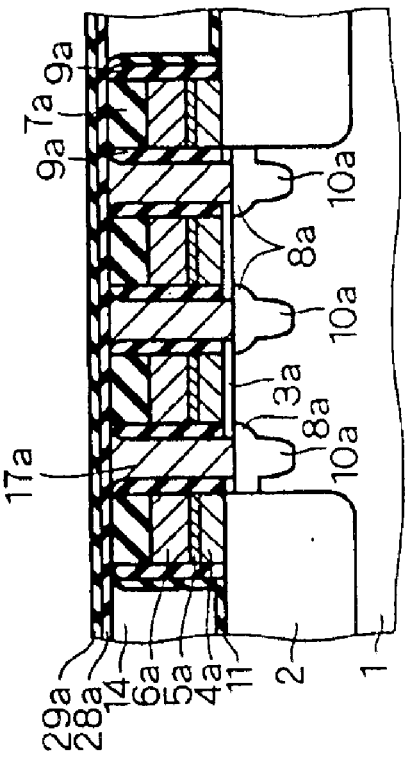

SEMICONDUCTOR DEVICE HAVING MEMORY CELL PORTION AND MANUFACTURING METHOD THEREOF

BACKGROUND OF THE INVENTION

1. Field of the Invention

The present invention relates to semiconductor devices, and particularly to a semiconductor device having a memory cell portion.

2. Description of the Background Art

Because of the increase in integration degree of semiconductor devices, and because of the miniaturization of memory cells particularly in semiconductor storage devices, it is becoming difficult to form contacts between interconnections without causing short circuits.

In order to form contacts without causing short circuits with interconnections, a method called self-alignment is often adopted. Contacts formed by the self-alignment technique are called self-aligned contacts (SAC).

In memory cell portions, in order to increase short circuits margin, it is common to form contacts by SAC etching using etching masks with large opening ratios, called bar-type or line-type, instead of hole-shaped ones, which is followed by chemical mechanical polishing (CMP).

For example, Japanese Patent Application Laid-Open No. 6-216333 (1994: Column 4, FIGS. 3 and 4) describes a method for forming contacts using self-alignment technique.

As described in the patent document cited above, transistors in the memory cell portion and transistors in the peripheral circuit portion are formed simultaneously, and therefore the transistors in the peripheral circuit portion undergo a thermal process for improving the burying characteristics of interlayer insulating film in the memory cell portion and a thermal process for improving the refresh characteristics, which causes thermal diffusion of impurities in the source/drain regions of transistors in the peripheral circuit portion that require impurities at high concentration, possibly reducing punch-through margin of the transistors in the peripheral circuit portion.

Furthermore, while SAC etching was conventionally not applied to peripheral circuit portions, the demand to enhance the degree of integration is now requiring the technique to be applied also to peripheral circuit portions, and further miniaturization of semiconductor devices is now necessitating ensuring short circuits margin and enhancing current driving capability also in the peripheral circuit portions.

SUMMARY OF THE INVENTION

A semiconductor device having a memory cell portion and a peripheral circuit portion is provided which achieves suppression of reduction of punch-through margin of transistors in the peripheral circuit portion and offers ensured short circuits margin and enhanced current driving capability.

The present invention is related to a method for manufacturing a semiconductor device having a data holding portion and a peripheral circuit portion that operates in association with the data holding portion, the data holding portion and the peripheral circuit portion being provided on the same semiconductor substrate; the semiconductor device manufacturing method includes the steps (a) to (h) shown below. That is to say, (a) forming gate interconnections respectively in the data holding portion and the peripheral circuit portion on the semiconductor substrate, each gate interconnection having its top covered by a silicon nitride film; (b) forming first impurity regions respectively in the data holding portion and the peripheral circuit portion, the respective first impurity regions being formed in the surface of the semiconductor substrate that extend outward from sides of the respective gate interconnections; (c) forming first sidewall nitride films respectively on sides of the gate interconnections in the data holding portion and the peripheral circuit portion; (d) forming second impurity regions respectively in the data holding portion and the peripheral circuit portion, the respective second impurity regions being formed in the surface of the semiconductor substrate that extend outward from sides of the respective first sidewall nitride films; (e) forming a first interlayer insulating film covering the data holding portion and the peripheral circuit portion; (f) selectively removing the first interlayer insulating film on the data holding portion to form first openings that at least reach the surface of the semiconductor substrate where the first and second impurity regions are formed, and burying a conductive silicon in the first openings to form contact plugs; (g) after formation of the contact plugs, covering the data holding portion with a resist mask, and removing the first interlayer insulating film on the peripheral circuit portion by a wet-etching; and (h) after the step (g), in the peripheral circuit portion, performing a third impurity implantation into the surface of the semiconductor substrate in the peripheral circuit portion using, as an implant mask, the gate interconnection at least having the first sidewall nitride films, so as to form third impurity regions having a higher impurity concentration than the first and second impurity regions.

In the above-described semiconductor device manufacturing method, the step of forming the third impurity regions in the peripheral circuit portion is performed after the formation of the first interlayer insulating film. Therefore, the peripheral circuit portion, after the formation of the third impurity regions, does not experience a high-temperature (800° C. to 1000° C.) thermal process performed to improve the burying characteristics during the formation of the first interlayer insulating film. Also, the step of forming the third impurity regions in the peripheral circuit portion is performed after the formation of the contact plugs. Therefore, the peripheral circuit portion, after the formation of the third impurity regions, does not experience a high-temperature (800° C. to 1000° C.) thermal process performed to improve the refresh characteristics after the formation of the contact plugs. Thus the third impurity regions having a relatively high concentration and serving as source/drain regions of MOS transistors in the peripheral circuit portion are not affected by high-temperature (800° C. to 1000° C.) thermal treatments, which prevents reduction of punch-through margin of the MOS transistors in the peripheral circuit portion.

A first aspect of the semiconductor device of the present invention is related to a semiconductor device having a data holding portion and a peripheral circuit portion that operates in association with the data holding portion, the data holding portion and the peripheral circuit portion being formed on the same semiconductor substrate. The semiconductor device includes: gate interconnections provided respectively in the data holding portion and the peripheral circuit portion on the semiconductor substrate, each gate interconnection having its top covered by a silicon nitride film; first sidewall nitride films provided respectively on sides of the gate interconnections in the data holding portion and the peripheral circuit portion; first and second impurity regions provided in the data holding portion and the peripheral circuit portion, the respective first and second impurity regions being selectively formed in the surface of the semiconductor substrate that extend outward from sides of the respective gate interconnections; sidewall insulating films provided on sides of the first sidewall nitride films of the gate interconnection in the peripheral circuit portion; contact plugs composed of a conductive silicon and passing through a first interlayer insulating film provided on the data holding portion to reach the surface of the semiconductor substrate where the first and second impurity regions are formed; third impurity regions provided in the peripheral circuit portion, the third impurity regions being selectively formed in the surface of the semiconductor substrate that extend outward from sides of the sidewall insulating films and having a higher impurity concentration than the first and second impurity regions; and metal silicide films provided on all contact plugs in the data holding portion and on the surface of the semiconductor substrate in the peripheral circuit portion where the third impurity regions are formed.

The semiconductor device above includes metal silicide films formed on top of all contact plugs in the data holding portion and on the semiconductor substrate in the peripheral circuit portion where the third impurity regions are formed, i.e. on surfaces of active regions. In the memory cell portion, this lowers the contact resistance of bit line contacts and storage node contacts formed later. Also, in the peripheral circuit portion, this not only reduces the contact resistance between bit line contacts formed later and active regions but also reduces the sheet resistance of the active regions, which enhances the current driving capability of the peripheral circuit portion.

A second aspect of the semiconductor device of the invention is related to a semiconductor device having a data holding portion and a peripheral circuit portion that operates in association with the data holding portion, the data holding portion and the peripheral circuit portion being formed on the same semiconductor substrate. The semiconductor device includes: gate interconnections provided respectively in the data holding portion and the peripheral circuit portion on the semiconductor substrate, each gate interconnection having its top covered by a silicon nitride film; first sidewall nitride films provided respectively on sides of the gate interconnections in the data holding portion and the peripheral circuit portion; first and second impurity regions provided in the data holding portion and the peripheral circuit portion, the respective first and second impurity regions being selectively formed in the surface of the semiconductor substrate that extend outward from sides of the respective gate interconnections; sidewall insulating films provided on sides of the first sidewall nitride films of the gate interconnection in the peripheral circuit portion; contact plugs composed of conductive silicon and passing through a first interlayer insulating film provided on the data holding portion to reach the surface of the semiconductor substrate where the first and second impurity regions are formed; third impurity regions provided in the peripheral circuit portion, the third impurity regions being selectively formed in the surface of the semiconductor substrate that extend outward from sides of the sidewall insulating film and having a higher impurity concentration than the first and second impurity regions; and a metal silicide film provided only on the surface of the semiconductor substrate in the peripheral circuit portion where the third impurity regions are formed.

According to the semiconductor device above, a metal silicide film is formed only on the surface of the semiconductor substrate in the peripheral circuit portion where the third impurity regions are formed. In the peripheral circuit portion, this not only reduces the contact resistance between bit line contacts formed later and active regions but also reduces the sheet resistance of the active regions, which enhances the current driving capability of the peripheral circuit portion.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 1 to 16 are cross-sectional views used to describe a sequence of process steps for manufacturing a semiconductor device according to a first preferred embodiment of the invention;

FIGS. 19 and 20 are plan views of the memory cell portion after formation of contact plugs;

FIGS. 32 to 35 are cross-sectional views used to describe a sequence of process steps for manufacturing a semiconductor device according to a third preferred embodiment of the invention;

FIGS. 36 to 41 are cross-sectional views used to describe a sequence of process steps for manufacturing a semiconductor device according to a fourth preferred embodiment of the invention;

FIGS. 42 to 45 are cross-sectional views used to describe a sequence of process steps for manufacturing a semiconductor device according to a fifth preferred embodiment of the invention; and FIGS. 46 to 52 are cross-sectional views used to describe a sequence of process steps for manufacturing a semiconductor device according to a sixth preferred embodiment of the invention.

DESCRIPTION OF THE PREFERRED EMBODIMENTS

A. First Preferred Embodiment

Figure 2:
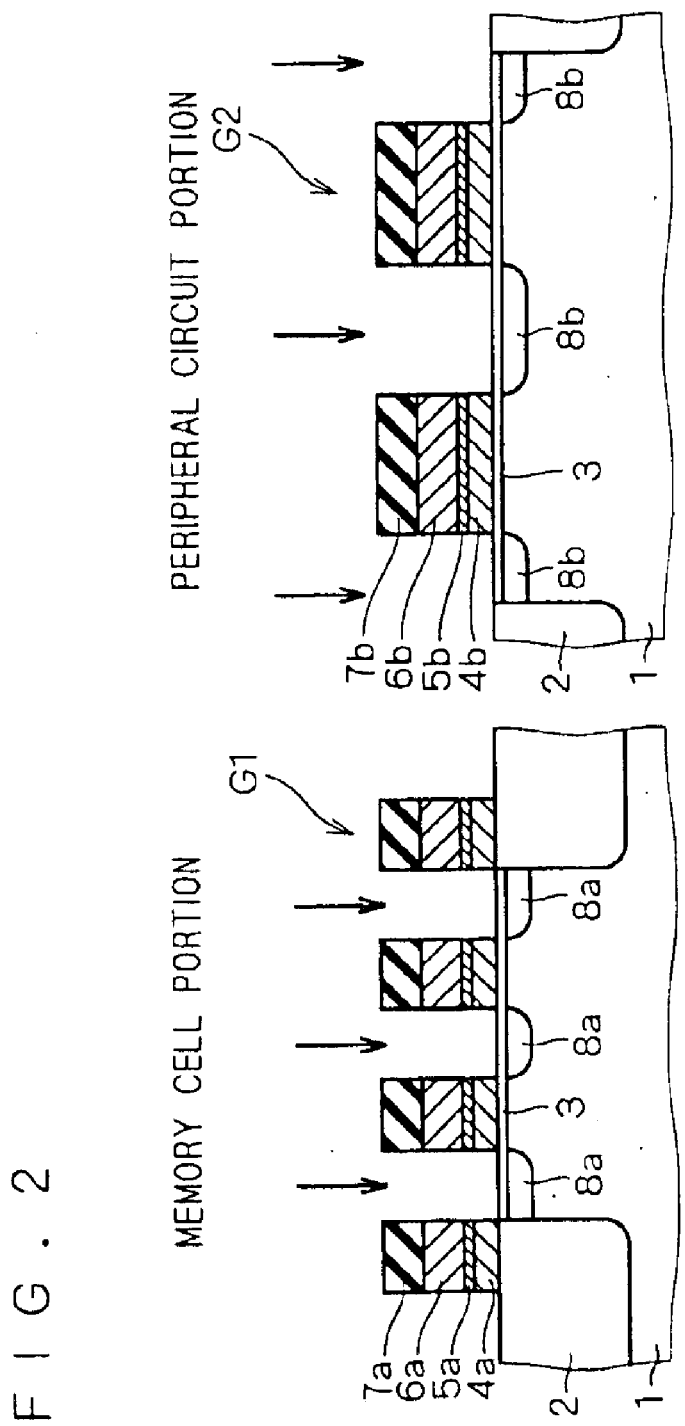

A first preferred embodiment of the present invention is now described referring to FIGS. 1 to 24.

A-1. Manufacturing Method

Referring to the cross-sectional views of FIGS. 1 to 16 showing a sequence of manufacturing process steps, a method for manufacturing a DRAM (Dynamic Random Access Memory) 100 is now described. The structure of DRAM 100 is depicted in FIG. 16 that is used to describe the final process step.

In FIGS. 1 to 16, a memory cell portion of the DRAM 100 and a peripheral circuit portion (including logic circuitry, sense amplifiers, decoders, etc.) provided in the vicinity of the memory cell portion are shown side by side.

First, in the process step shown in FIG. 1, a semiconductor substrate 1, e.g. a silicon substrate, is prepared, and element isolation oxide films 2, for isolation between elements, are selectively formed to define active regions.

The element isolation oxide films 2 are formed by thermal oxidation (LOCOS oxidation) or a process of burying oxide film in trenches (trench isolation).

Then, the active regions (the regions of semiconductor substrate 1 defined by element isolation oxide films 2) undergo impurity implantation for forming MOS transistor well and channel regions.

Subsequently, a silicon oxide film 3 is formed all over the substrate and a conductive silicon film 4, barrier metal film 5, metal interconnection film 6, and protective insulating film 7 are sequentially stacked thereon. While these stacked films are shown assuming poly-metal gates, the barrier metal layer 5 can be omitted in the case of polycide gates, in which case a silicide film is formed on the silicon film 4.

Now, the silicon oxide film 3 is a thermal oxide film or an undoped deposited oxide film formed by reduced pressure CVD or atmospheric CVD, with a film thickness of 1 nm to 10 nm.

The conductive silicon film 4 is formed of polycrystalline silicon or amorphous silicon deposited by CVD, which contains any of phosphorus (P), arsenic (As) and boron (B) and has a thickness of 20 nm to 150 nm.

The barrier metal film 5 is formed of a refractory metal film such as titanium nitride (TiN) or tungsten nitride (WN), with a film thickness of 2 nm to 10 nm.

The metal interconnection film 6 is formed of a refractory metal film such as tungsten (W), with a film thickness of 20 nm to 150 nm.

In the case of polycide gates, a metal silicide film with a thickness of 20 nm to 150 nm, such as tungsten silicide (WSi), is formed on the conductive silicon film 4.

The protective insulating film 7 is formed of a material that exhibits selectivity with respect to silicon oxide film during dry-etching of silicon oxide film by, e.g. RIE (Reactive Ion Etching); for example, it is formed of a silicon nitride film (SiN) or oxynitride film (SiON) deposited by CVD, or a multi-layered film thereof, or a two-layered film of silicon oxide film and silicon nitride film. The film thickness of the protective insulating film 7 is 20 nm to 100 nm.

Next, in the process step of FIG. 2, a resist mask (not shown), for formation of a desired gate interconnection pattern, is patterned by photolithography on the protective insulating film 7, and then a dry-etching to silicon oxide, e.g. by RIE, is performed to pattern the protective insulating film 7 to fit the gate interconnection pattern.

Next, using the protective insulating film 7 as an etching mask, dry-etching to metal and polycrystalline silicon (polysilicon) is performed, e.g. by RIE, so as to pattern the metal interconnection film 6, barrier metal film 5, and conductive silicon film 4 to fit the gate interconnection pattern. Thus, on the silicon oxide film 3 in the memory cell portion, the conductive silicon films 4a, barrier metal films 5a, metal interconnection films 6a, and protective insulating films 7a form gate interconnections G1, and on the silicon oxide film 3 in the peripheral circuit portion, the conductive silicon films 4b, barrier metal films 5b, metal interconnection films 6b, and protective insulating films 7b form gate interconnections G2.

Since this process uses an etching that exhibits a selectivity with respect to silicon oxide film, the silicon oxide film 3 is not completely removed but it remains on the semiconductor substrate 1. After this process, in order to reduce leakage current, an oxide film may be formed by thermal oxidation on the semiconductor substrate 1 and sidewalls of the silicon film 4.

Next, using the gate interconnections G1 and G2 as implant masks, an impurity ion implantation with a dose of $1 \times 10^{12}$ to $1 \times 10^{13}/cm^2$ is performed to form source/drain regions 8a (first impurity regions) in the memory cell portion and source/drain regions 8b (first impurity regions) in the peripheral circuit portion. In this case, when N-channel MOS transistors are formed, phosphorus (P) is implanted at an energy of 10 keV to 20 keV, or arsenic (As) is implanted at an energy of 15 keV to 30 keV. When P-channel MOS transistors are formed, boron difluoride (BF$_2$) is implanted at an energy of 5 keV to 10 keV. The source/drain regions 8a and 8b are referred to also as source/drain extension regions or lightly-doped drain regions (LDD regions).

Figure 3:
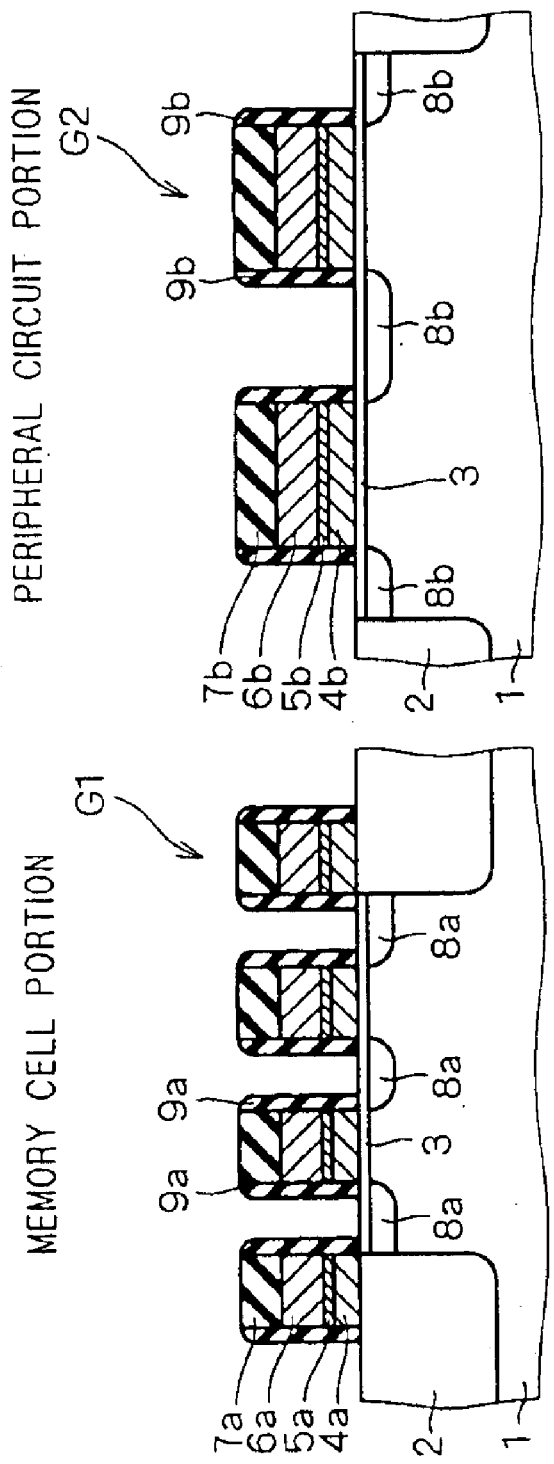

Next, a silicon nitride film with a thickness of 5 nm to 100 nm is deposited all over the semiconductor substrate 1, e.g. by CVD, and then an anisotropic dry-etching process, e.g. RIE, is applied all over the surface to form, as shown in FIG. 3, sidewall nitride films 9a and 9b (first sidewall nitride films) respectively on the sides of the gate interconnections G1 and G2.

Since this process uses an etching having a selectivity with respect to silicon oxide film, the silicon oxide film 3 is not completely removed.

The sidewall nitride films 9a and 9b are formed for the purpose of protecting the sidewalls of gate interconnections G1 and G2. Therefore the material is not limited to silicon nitride film as long as it exhibits selectivity during dry-etching of silicon oxide film by, e.g. RIE; it may be formed of an oxynitride film, for example.

Figure 4:
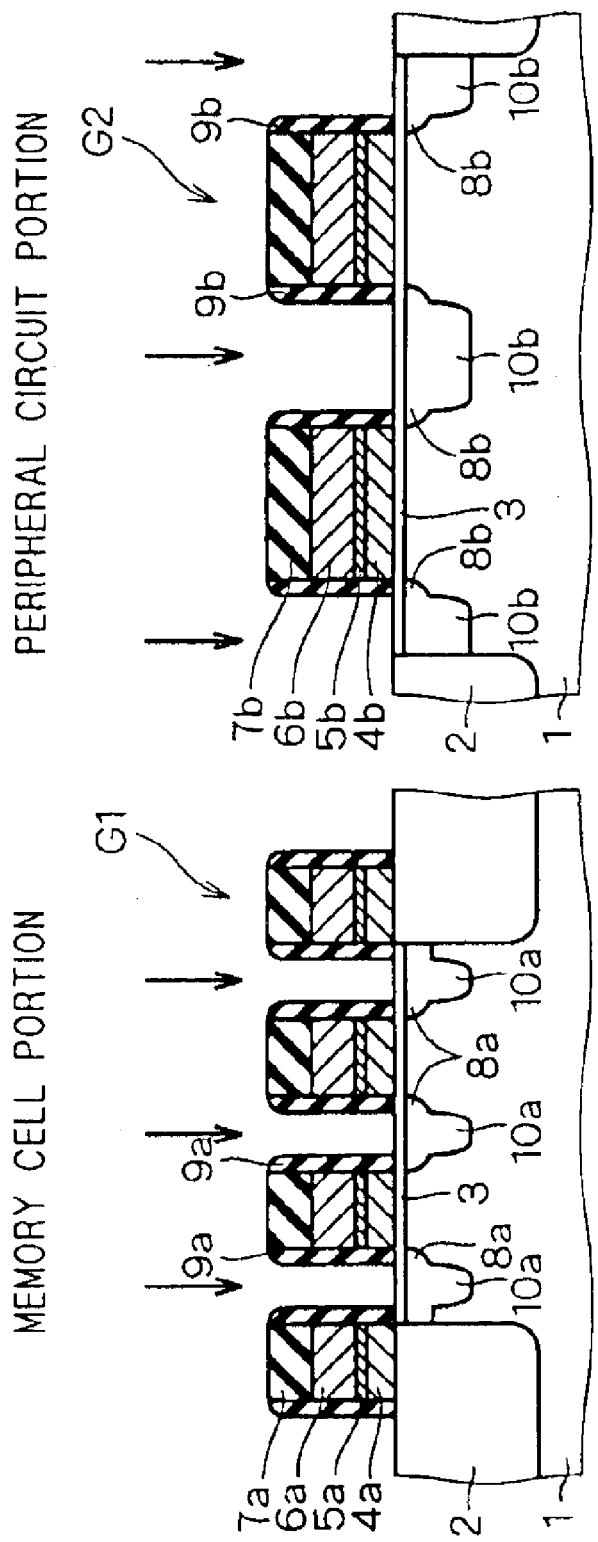

Next, in the process step shown in FIG. 4, using, as implant masks, the gate interconnections G1 and G2 respectively having the sidewall nitride films 9a and 9b, an impurity ion implantation with a dose of $1 \times 10^{13}$ to $1 \times 10^{14}/cm^2$ is performed to form source/drain regions 10a (second impurity regions) in the memory cell portion and source/drain regions 10b (second impurity regions) in the peripheral circuit portion. In this case, when N-channel MOS transistors are formed, phosphorus (P) is implanted at an energy of 20 keV to 30 keV, or arsenic (As) is implanted at an energy of 30 keV to 40 keV. When P-channel MOS transistors are formed, boron difluoride (BF$_2$) is implanted at an energy of 10 keV to 15 keV.

Thus implanting impurities after formation of the sidewall nitride films 9a and 9b provides effects such as junction relaxation and suppression of short-channel effect of transistors, especially in the memory cell portion.

Figure 5:
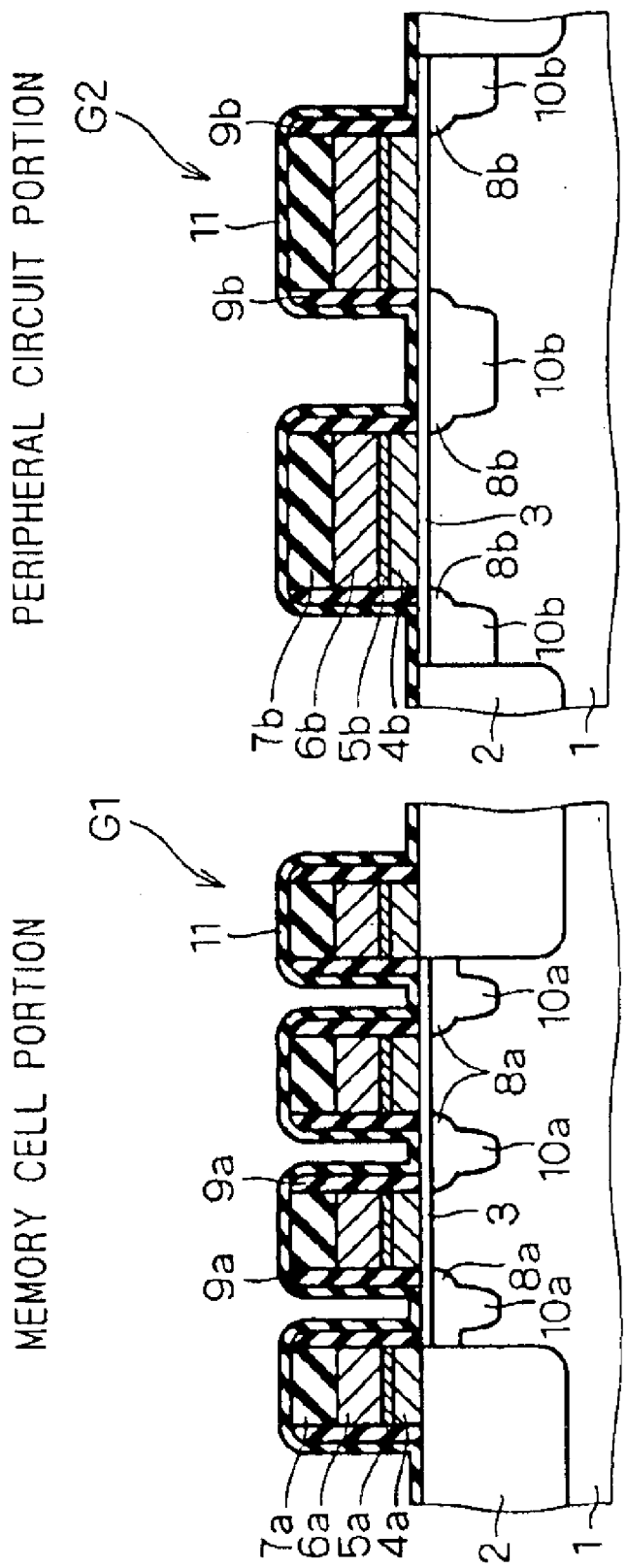

Next, in the process step of FIG. 5, in order to protect the semiconductor substrate 1, an insulating film 11 having a thickness of 5 nm to 50 nm is deposited all over the substrate. The insulating film 11 is a film that exhibits a selectively during dry-etching of silicon oxide film by, e.g. RIE; for example, it is a silicon nitride film or oxynitride film deposited by CVD. It is not essential to provide the insulating film 11.

Figure 6:
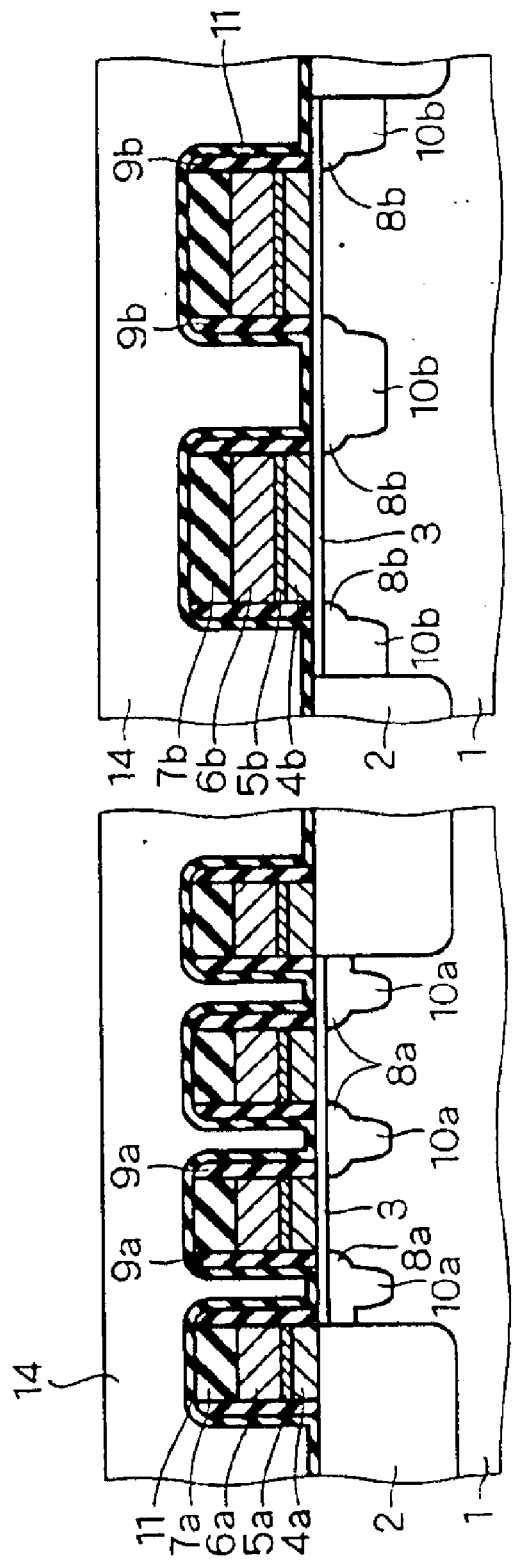
Figure 8:
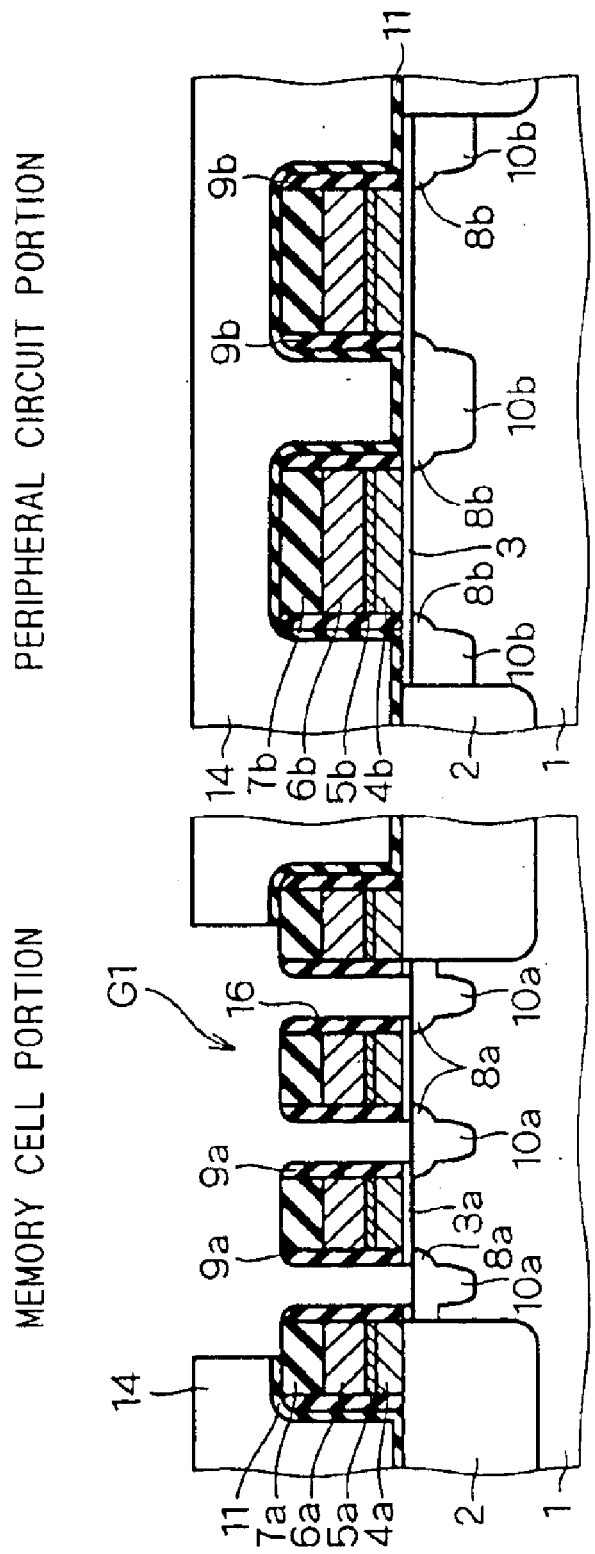

Next, in the process step of FIG. 6, an interlayer insulating film 14 (a first interlayer insulating film) having a thickness of 300 nm to 1000 nm is deposited all over the semiconductor substrate 1, e.g. by CVD. For the interlayer insulating film 14, a silicon oxide film doped with phosphorus or boron (e.g. BPTEOS or PTEOS) that exhibits a good burying characteristics and good flatness is deposited. Then a high-temperature (800° C. to 1000° C.) thermal process is performed to certainly fill gaps between gate interconnections and to reduce difference in level to improve the planarization.

Next, in the process step shown in FIG. 7, a resist mask RM1, having an opening OP1 in the area for contact plugs, is formed on the interlayer insulating film 14.

Then the portion of interlayer insulating film 14 located in the opening OP1 is removed by dry-etching, e.g. RIE, to form a contact opening 16. At this stage, by using an etching process with a large selectivity with respect to silicon nitride film, it is possible to prevent the protective insulating film 11 (e.g. silicon nitride film) from being completely removed.

Figure 17:
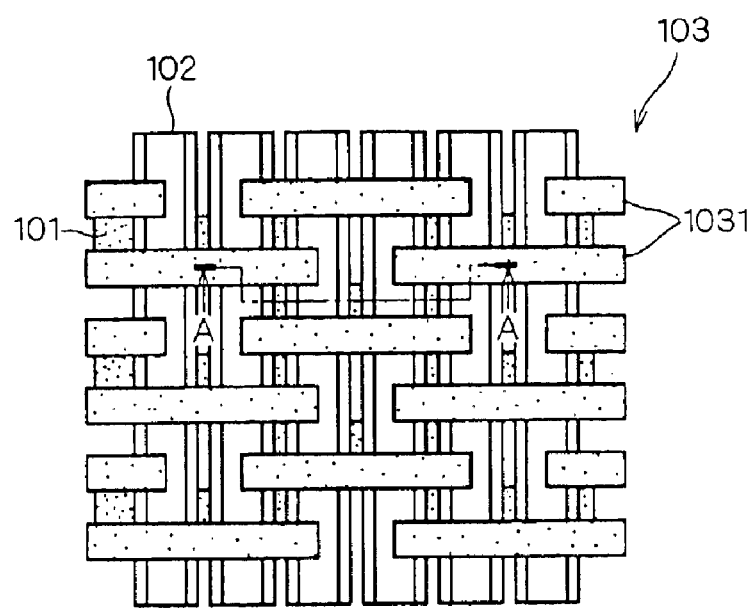
FIGS. 17 and 18 are plan views showing examples of resist mask pattern for formation of contact plugs in the memory cell portion.
Figure 18:
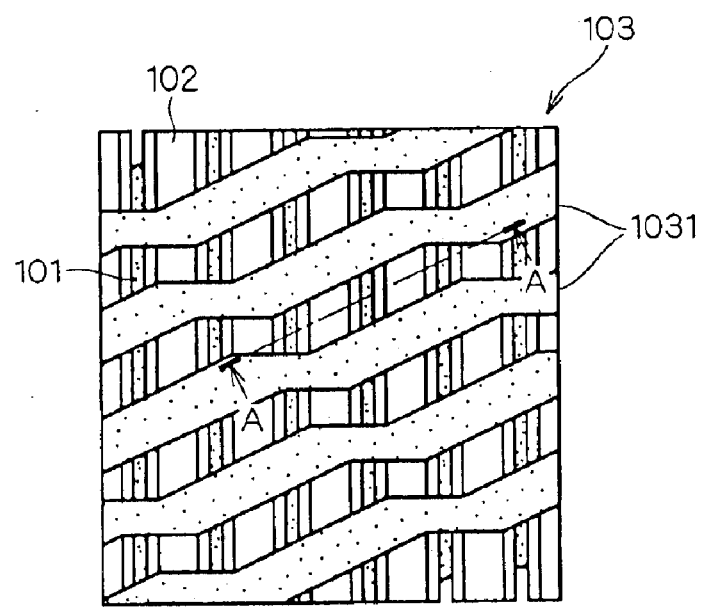

FIGS. 17 and 18 show examples of the plan pattern of the resist mask RM1 in the memory cell portion. Note that FIGS. 17 and 18 show only part of the resist mask RM1.

The pattern shown in FIG. 17 is called bar type, which is applied to half-pitch cells where the minimum unit length of cells corresponds to a half length of the repeated pattern in the plan arrangement of cells.

The pattern shown in FIG. 18 is called line type, which is applied to quarter-pitch cells where the minimum unit length of cells corresponds to a quarter length of the repeated pattern in the plan arrangement of cells.

In FIGS. 17 and 18, active regions 101 are present in the gaps between parallel-arranged stripe-shaped gate interconnections 102. In the resist mask 103 for forming contact plugs, resist material 1031 is formed on portions where contact plugs are not formed, even on active regions, while opening is present in the remaining portion.

In plan view, the resist material 1031 in FIG. 17 is formed in stripes extending over some gate interconnections 102, and in FIG. 18 it is formed like steps continuing over all gate interconnections 102.

The sections denoted by the arrows along line A—A in FIGS. 17 and 18 correspond to the cross-section of the memory cell portion shown in FIG. 7.

The gate interconnections 102 and resist mask 103 shown in FIGS. 17 and 18 respectively correspond to the gate interconnections G1 and resist mask RM1 shown in FIG. 7.

Now the next process step is described. After removal of the resist mask RM1, in the process step shown in FIG. 8, the insulating film 11 in the contact opening 16 is removed by dry-etching, e.g. RIE. At this stage, the etching conditions are set not only to remove the insulating film 11 and silicon oxide film 3 at the bottom of the contact opening 16 but also to remove the insulating film 11 covering the gate interconnections G1. However, since the gate interconnections G1 are covered by the protective insulating film 7a and sidewall nitride films 9a, it is possible to expose the main surface of the semiconductor substrate 1 without exposing gate interconnections G1. During this process, the portions of silicon oxide film 3 which are covered by the gate interconnections G1 are not removed, but they remain as gate insulating films 3a.

Figure 9:
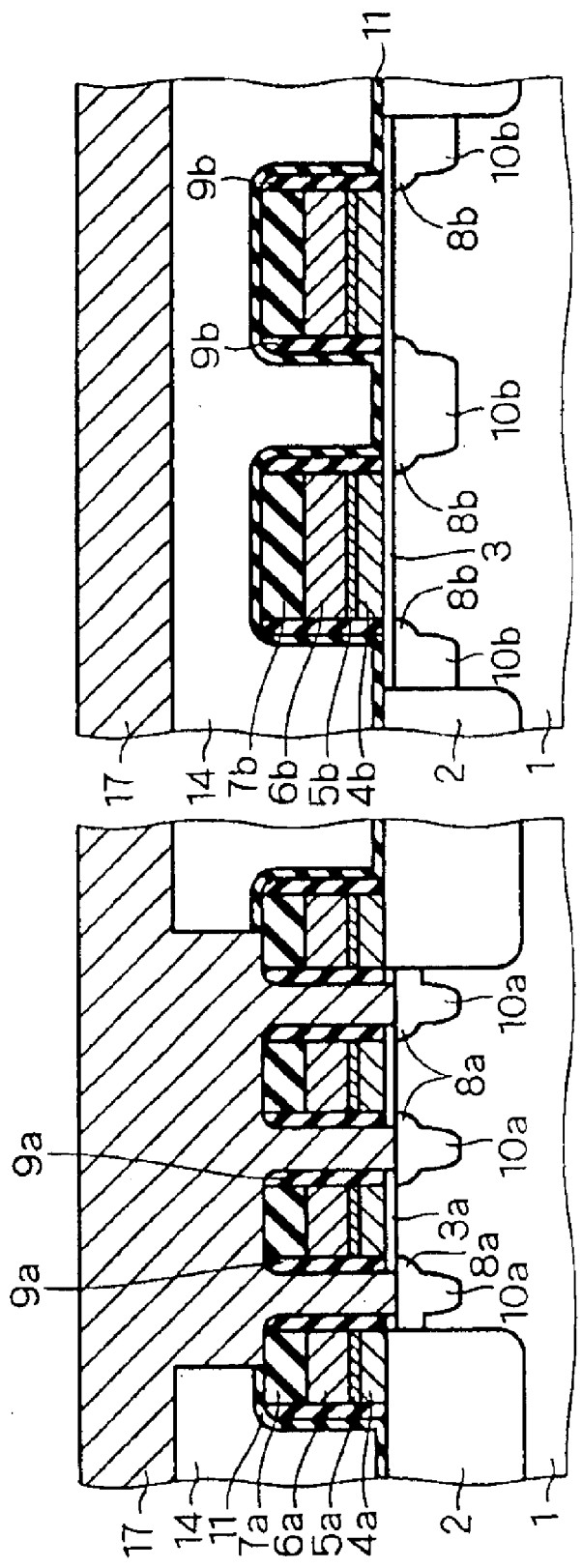

Next, in the process step of FIG. 9, a conductive silicon film 17, as plug material, is deposited all over the semiconductor substrate 1, filling the contact opening 16. The conductive silicon film 17 is polycrystalline silicon or amorphous silicon deposited by, e.g. CVD and doped with P or As, with a thickness of 100 nm to 400 nm.

Figure 10:
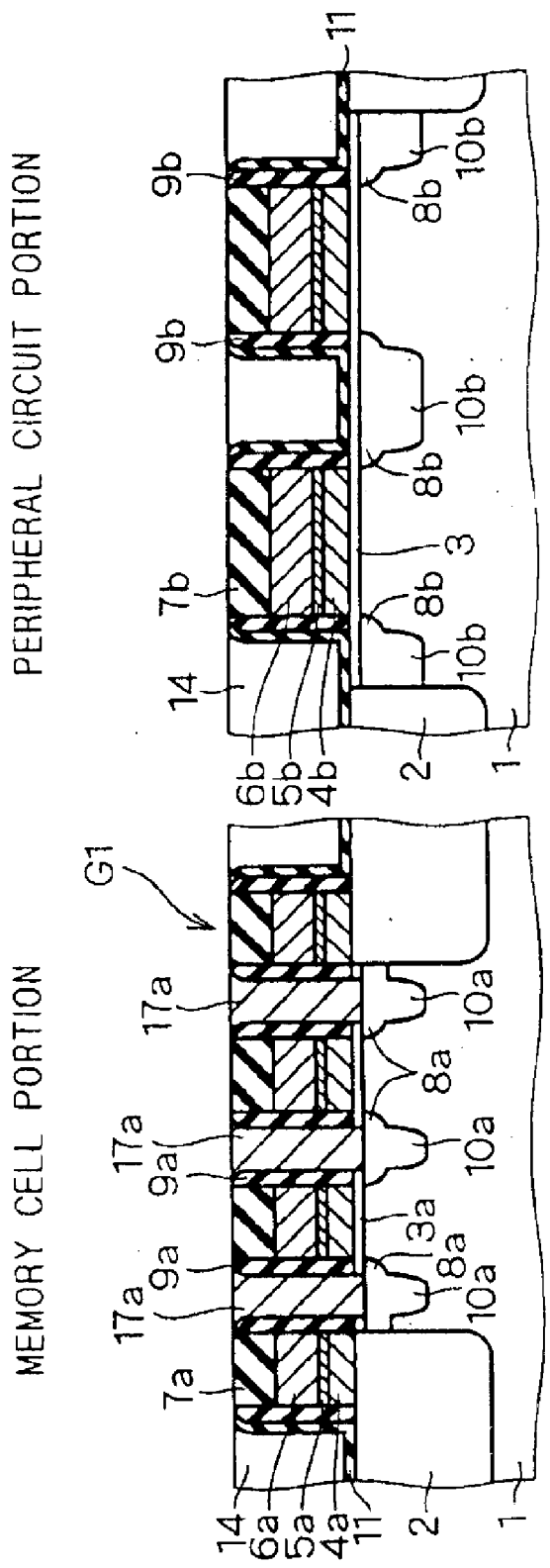

Next, in the process step of FIG. 10, a dry-etching process, e.g. RIE, and a polishing process, e.g. CMP, are performed in combination to remove the conductive silicon film 17, interlayer insulating film 14 and insulating film 11 until the top surfaces of the gate interconnections G1 and G2 are exposed. This process thus forms contact plugs 17a between gate interconnections G1.

Subsequently a high-temperature (800° C. to 1000° C.) thermal process is performed to improve the refresh characteristics.

FIGS. 19 and 20 are plan views of the memory cell portion where contact plugs 17a are formed.

FIG. 19 is a plan view obtained using a resist mask having the bar-type pattern described with FIG. 17, where contact plugs 104 are buried between gate interconnections 102, with interlayer insulating film 105 remaining in portions where the resist material 1031 is placed in FIG. 17.

FIG. 20 is a plan view showing a resist mask having the line-type pattern described with FIG. 19, where contact plugs 104 are buried between gate interconnections 102, with interlayer insulating film 105 remaining in portions where the resist material 1031 is placed in FIG. 17.

The contact plugs 104 and interlayer insulating films 105 shown in FIGS. 19 and 20 respectively correspond to the contact plugs 17a and interlayer insulating films 14 shown in FIG. 10.

Now the next process step is described. In the process step shown in FIG. 11, a resist mask RM2 is formed by photolithography to cover only the memory cell portion, and the interlayer insulating film 14 in the peripheral circuit portion is removed by wet-etching using a solution such as HF (hydrofluoric acid). During this process the insulating film 11 formed of silicon nitride film remains without being removed.

Figure 21:
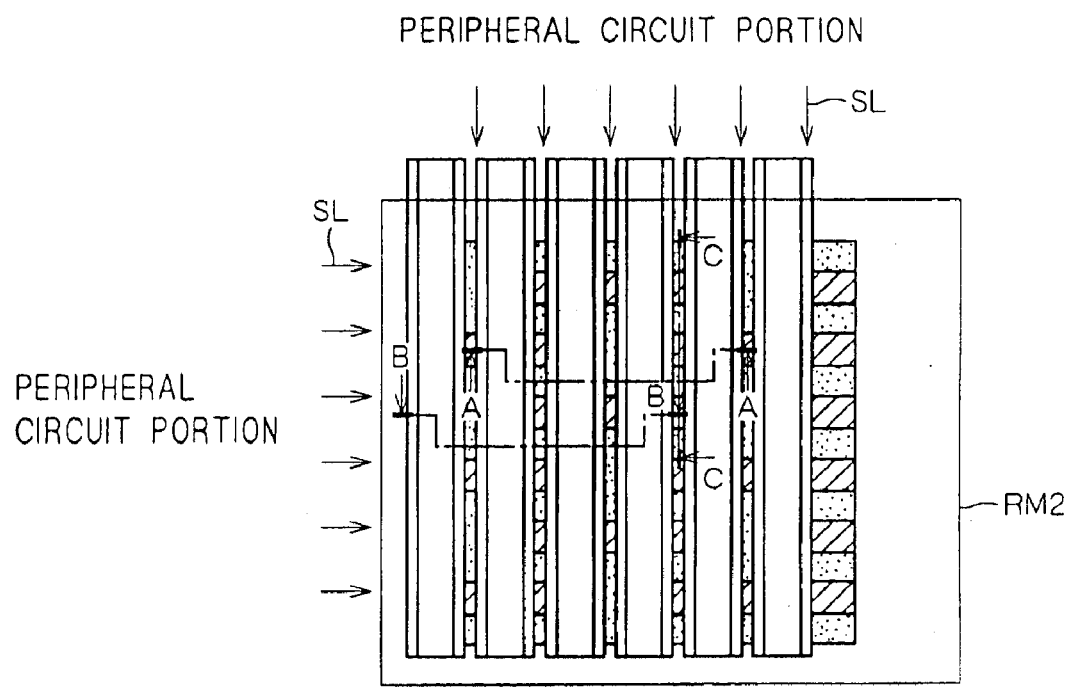
FIGS. 21 and 22 are plan views showing situations during a wet-etching process to the peripheral circuit portion.
Figure 22:
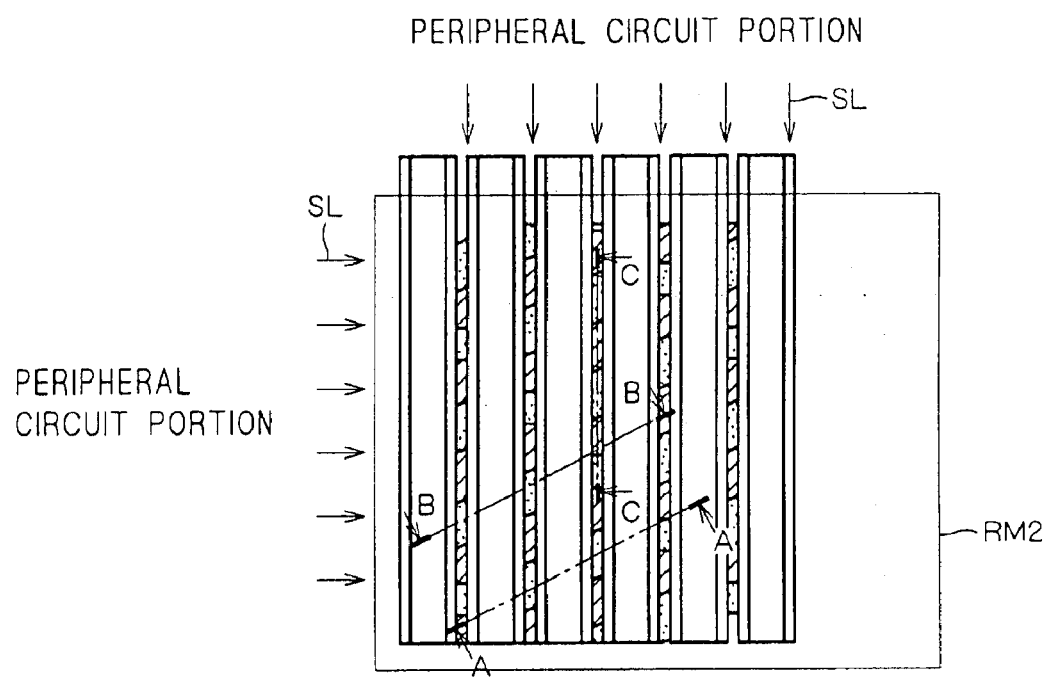

FIGS. 21 and 22 show plan views of the memory cell portion and peripheral circuit portion with the resist mask RM2 formed thereon.

FIG. 21 shows the memory cell portion described with FIG. 19 covered by resist mask RM2, and FIG. 22 shows the memory cell portion described with FIG. 20 covered by resist mask RM2.

Figure 23:
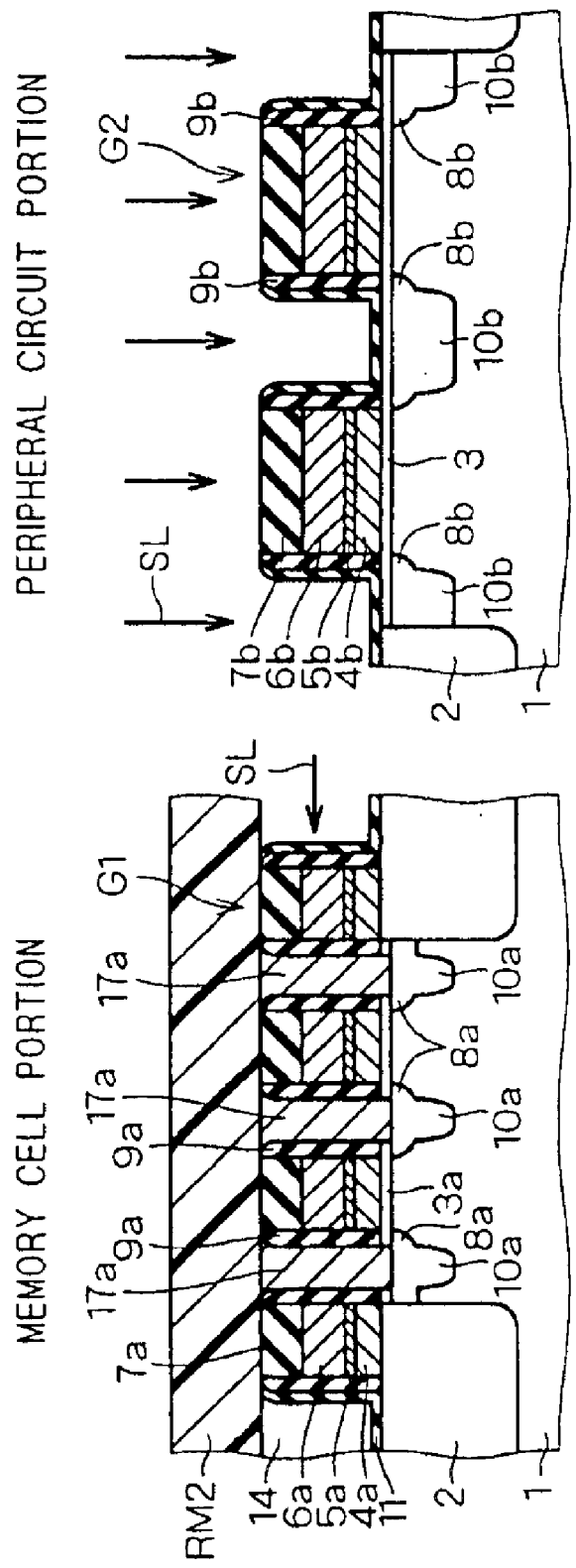
FIGS. 23 and 24 are cross-sectional views showing the situations during the wet-etching process to the peripheral circuit portion.
Figure 24:
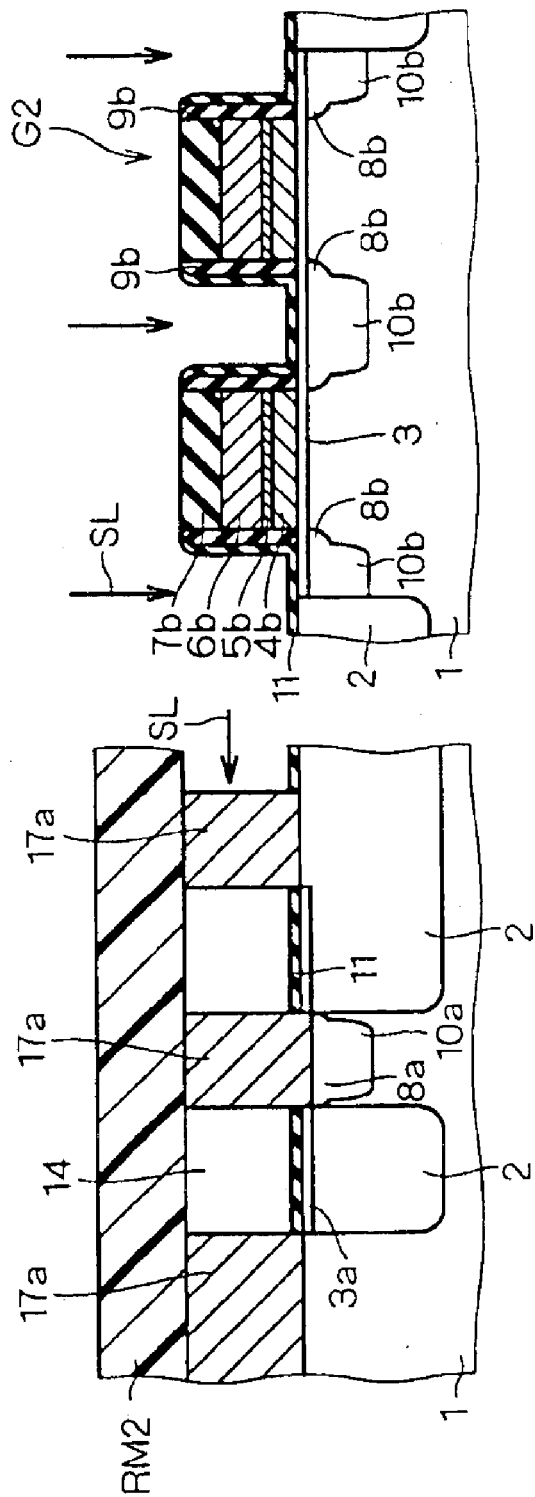

FIGS. 23 and 24 show cross-sectional views taken along lines B—B and C—C with arrows in FIGS. 21 and 22.

As shown in FIGS. 23 and 24, the peripheral circuit portion, not covered by the resist mask RM2, touches etching solution SL. However, in the memory cell portion, the gate interconnections G1 and contact plugs 17a form a barrier against the etching solution at the borders with the peripheral circuit portion, preventing the etching solution SL from invading the memory cell portion. This prevents the interlayer insulating film 14 in the memory cell portion from being etched. Therefore the interlayer insulating film 14 is removed only in the peripheral circuit portion. This is called "self-aligned removal" of the interlayer insulating film 14.

The next process step is described. First, the resist mask RM2 is removed, and a resist mask RM3 is formed to cover the memory cell portion at least. Then, in the process step of FIG. 12, an anisotropic dry-etching is performed to remove the silicon oxide film 3 and insulating film 11 on the semiconductor substrate 1 in the peripheral circuit portion, leaving the insulating film 11 as sidewall insulating films 11b on the sides of the sidewall nitride films 9. Then, using the gate interconnections G2 as implant masks, an impurity ion implantation with a dose of $1\times10^{15}$ to $1\times10^{16}/cm^2$ is performed to form source/drain regions 31b (third impurity regions) in the peripheral circuit portion. In this case, when N-channel MOS transistors are formed, phosphorus (P) is implanted at an energy of 35 keV to 45 keV, or arsenic (As) is implanted at an energy of 50 keV to 60 keV. When P-channel MOS transistors are formed, boron (B) is implanted at an energy of 5 keV to 10 keV, or boron difluoride ($BF_2$) is implanted at an energy of 20 keV to 30 keV. The source/drain regions 31b are source/drain regions adapted for MOS transistors in the peripheral circuit portion.

This impurity ion implantation process may be conducted with the silicon oxide film 3 and insulating film 11 remaining on the semiconductor substrate 1 in the peripheral circuit portion, and then the insulating film 11 and silicon oxide film 3 are removed by anisotropic dry-etching.

While this dry-etching removes silicon oxide film 3 exposed on the semiconductor substrate 1, the portions of silicon oxide film 3 covered by the gate interconnections G2 are not removed but remain as gate insulating films 3b. Also, the insulating film 11 remains on the sides of the gate interconnections G2.

Figure 13:
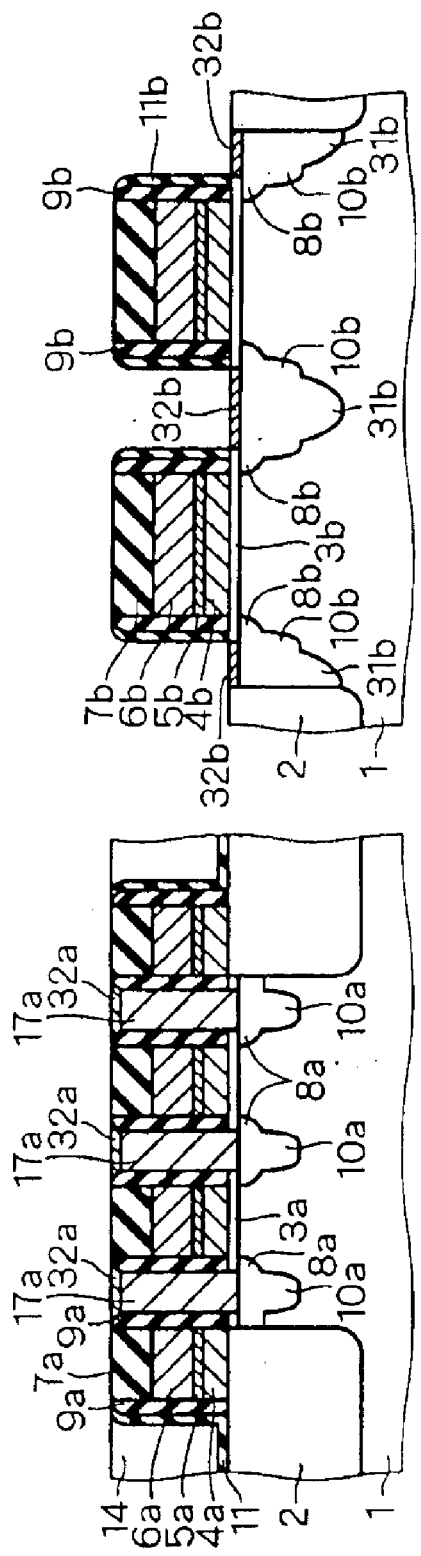

Next, after removal of resist mask RM3, in the process step of FIG. 13, metal silicide films 32a and 32b are simultaneously formed on the surfaces of contact plugs 17a exposed in the memory cell portion and on the surface of semiconductor substrate 1 exposed in the peripheral circuit portion, i.e. on the surfaces of active regions.

In general, the metal silicide films 32a and 32b are formed by depositing a refractory metal, such as cobalt (Co), titanium (Ti), nickel (Ni), or hafnium (Hf), on the surfaces of the semiconductor substrate 1 and contact plugs 17a and then causing a silicide reaction between silicon and metal by thermal process.

Next, in the process step of FIG. 14, a silicon oxide film, as an interlayer insulating film 18 (a second interlayer insulating film), is deposited all over the semiconductor substrate 1 by, e.g. low pressure CVD or atmospheric pressure CVD. The film thickness of the interlayer insulating film 18 is 50 nm to 500 nm and it may be undoped or doped with phosphorus or boron.

Figure 15:
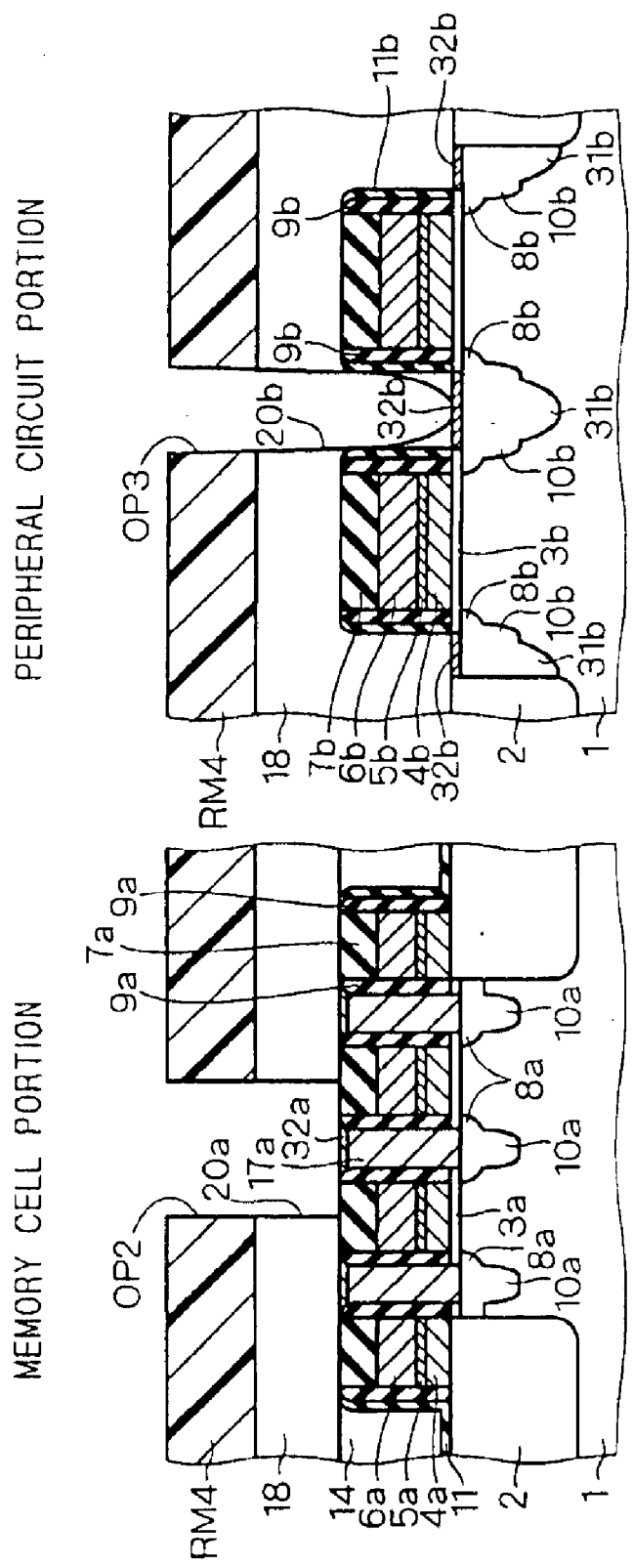
Figure 16:
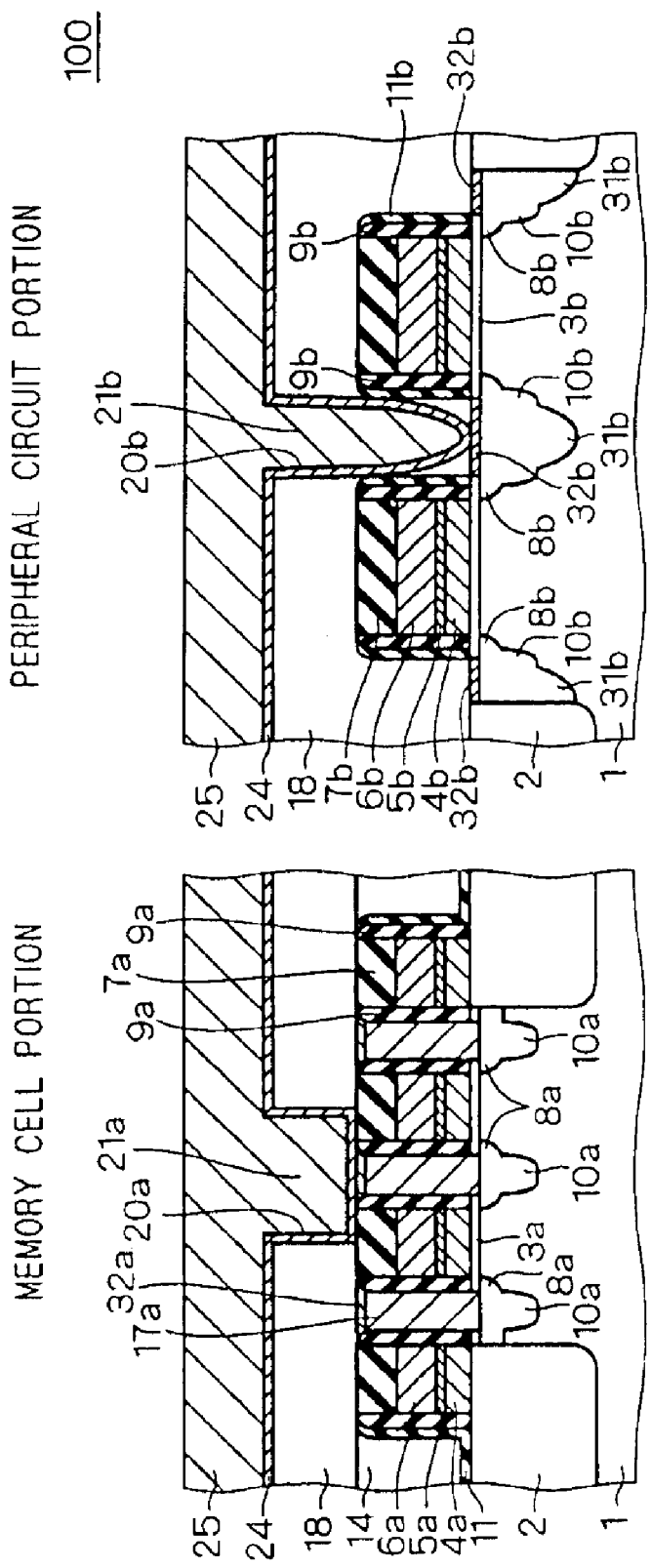

Subsequently, as shown in FIG. 15, a resist mask RM4 is formed which respectively have openings OP2 and OP3 in areas where bit line contacts are to be formed in the memory cell portion and peripheral circuit portion. Then, using the resist mask RM4 as an etching mask, the interlayer insulating film 18 is selectively etched by dry-etching, e.g. RIE, so as to form contact openings 20a and 20b in the memory cell portion and peripheral circuit portion.

This etching process uses an etching that exhibits a large selectivity with respect to silicon nitride film and silicon film. Thus the contact opening 20a in the memory cell portion reaches metal silicide film 32a on contact plug 17a and the contact opening 20b in the peripheral circuit portion reaches metal silicide film 32b on semiconductor substrate 1.

The contact openings 20a and 20b can be referred to as SAC contacts since they are obtained in a self-aligned manner, which relaxes resist mask positioning margin for contact formation and thus shortens the manufacturing process.

Next, in the process step of FIG. 16, metal films 24 and 25 are sequentially deposited all over the semiconductor substrate 1, so that the metal films 24 and 25 fill the contact openings 20a and 20b. Bit line contacts 21a and 21b are thus formed. The metal film 24 is a barrier metal, such as Ti or TiN, having a film thickness of 20 nm to 100 nm. The metal film 25 is a silicide film of a refractory metal, e.g. W, or a metal film of, e.g. W or Al (aluminum), or a multi-layered film thereof, having a film thickness of 50 nm to 200 nm.

Then, in order to form a desired bit line pattern, a resist mask patterning process by photolithography and a dry-etching process, e.g. RIE, using the resist mask are carried out to form desired bit lines; the main part of the DRAM 100 is thus completed.

A-2. Functions and Effects

Figure 12:
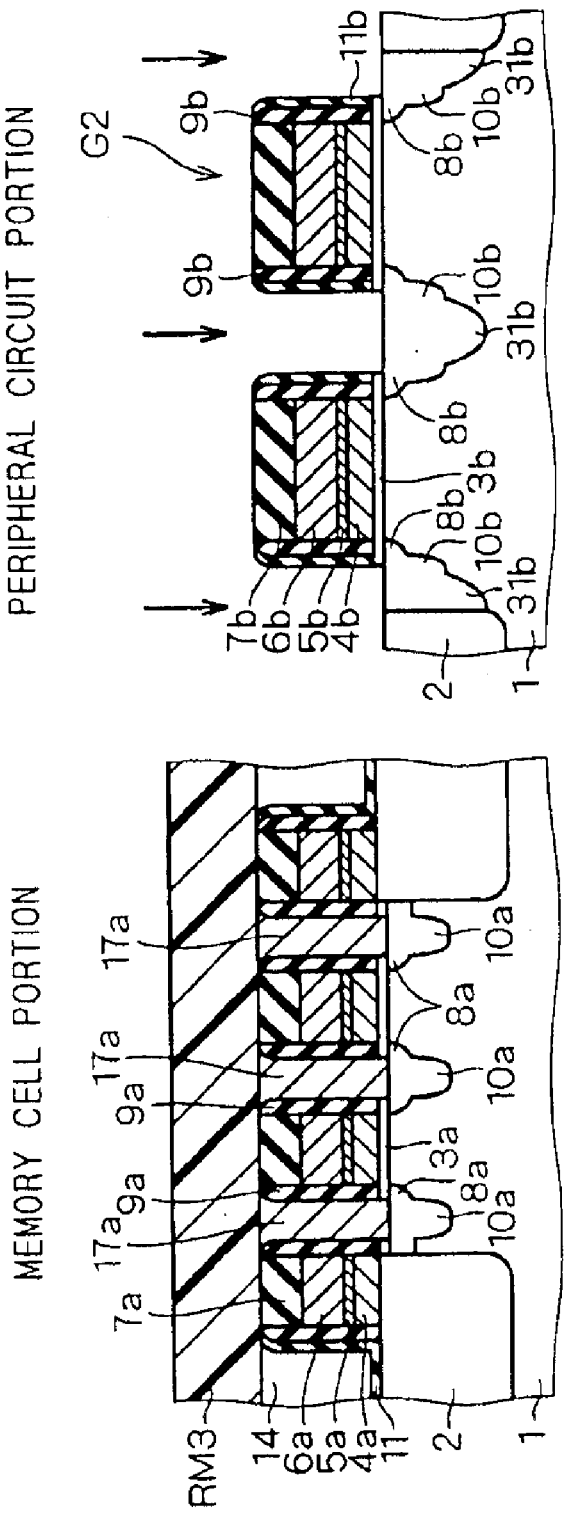

In the above-described manufacturing method of the first preferred embodiment, the formation of source/drain regions 31b in the peripheral circuit portion described referring to FIG. 12 is performed after the formation of the interlayer insulating film 14 described referring to FIG. 6. Therefore, the peripheral circuit portion, after the formation of source/drain regions 31b, does not experience the high-temperature (800° C. to 1000° C.) thermal process performed to improve the burying characteristics during the formation of the interlayer insulating film 14.

Also, the formation of source/drain regions 31b in the peripheral circuit portion is performed after the formation of contact plugs 17a described referring to FIG. 10. Therefore, the peripheral circuit portion, after the formation of the source/drain regions 31b, does not experience the high-temperature (800° C. to 1000° C.) thermal process performed to improve the refresh characteristics after the formation of contact plugs 17a.

Thus the source/drain regions 31b of MOS transistors in the peripheral circuit portion are not affected by high-temperature (800° C. to 1000° C.) thermal treatments, which avoids reduction of punch-through margin of the MOS transistors in the peripheral circuit portion.

Furthermore, in the memory cell portion, the metal silicide films 32a are formed on the top surfaces of all contact plugs 17a. This lowers the contact resistance of bit line contact 21a and storage node contacts (not shown).

In particular, storage node contacts that connect bit line contacts 21a and storage nodes (not shown) of storage capacitors formed above the bit lines have a large aspect ratio of opening depth to width, so that it is difficult to form silicide films at the hole bottoms after formation of openings. However, the metal silicide films 32a formed on top of the contact plugs 17a lower the contact resistance of the storage node contacts.

Moreover, in the peripheral circuit portion, the formation of metal silicide films 32b on the semiconductor substrate 1 not only reduces the contact resistance between bit line contacts 21b and active regions but also reduces the sheet resistance of the active regions, which enhances the current driving capability of the peripheral circuit portion.

B. Second Preferred Embodiment

Next, a second preferred embodiment of the present invention is described referring to FIGS. 25 to 31.

B-1. Manufacturing Method

Figure 29:
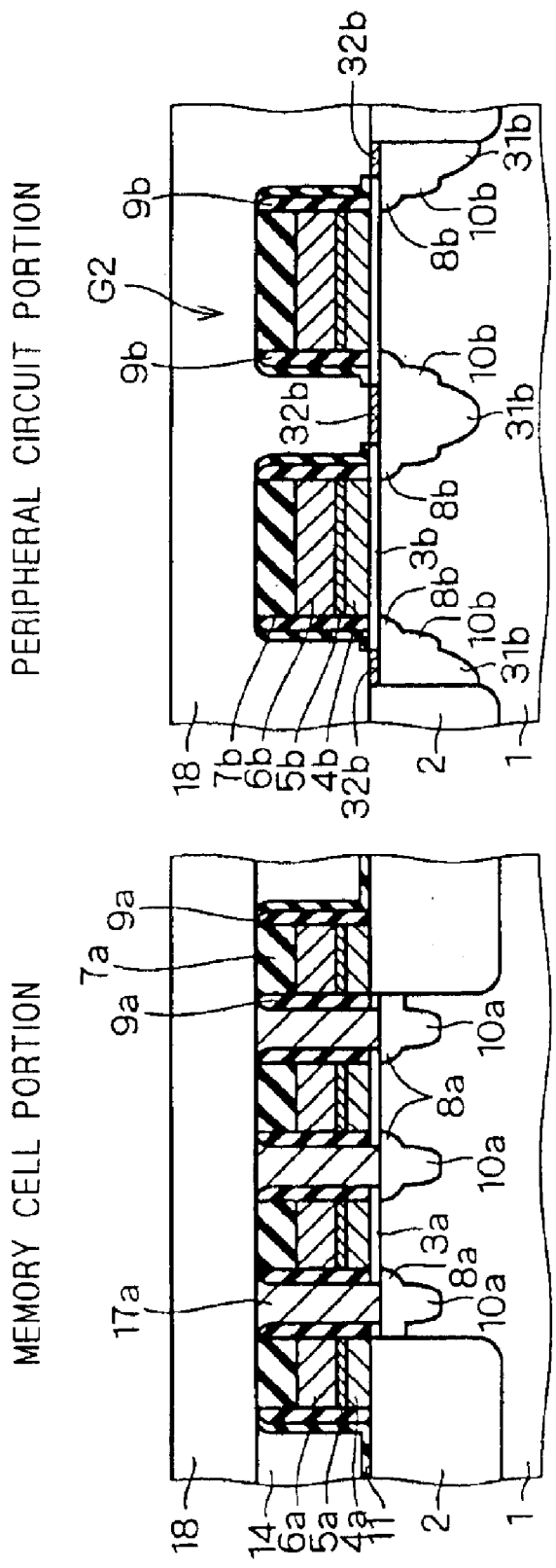
Figure 30:
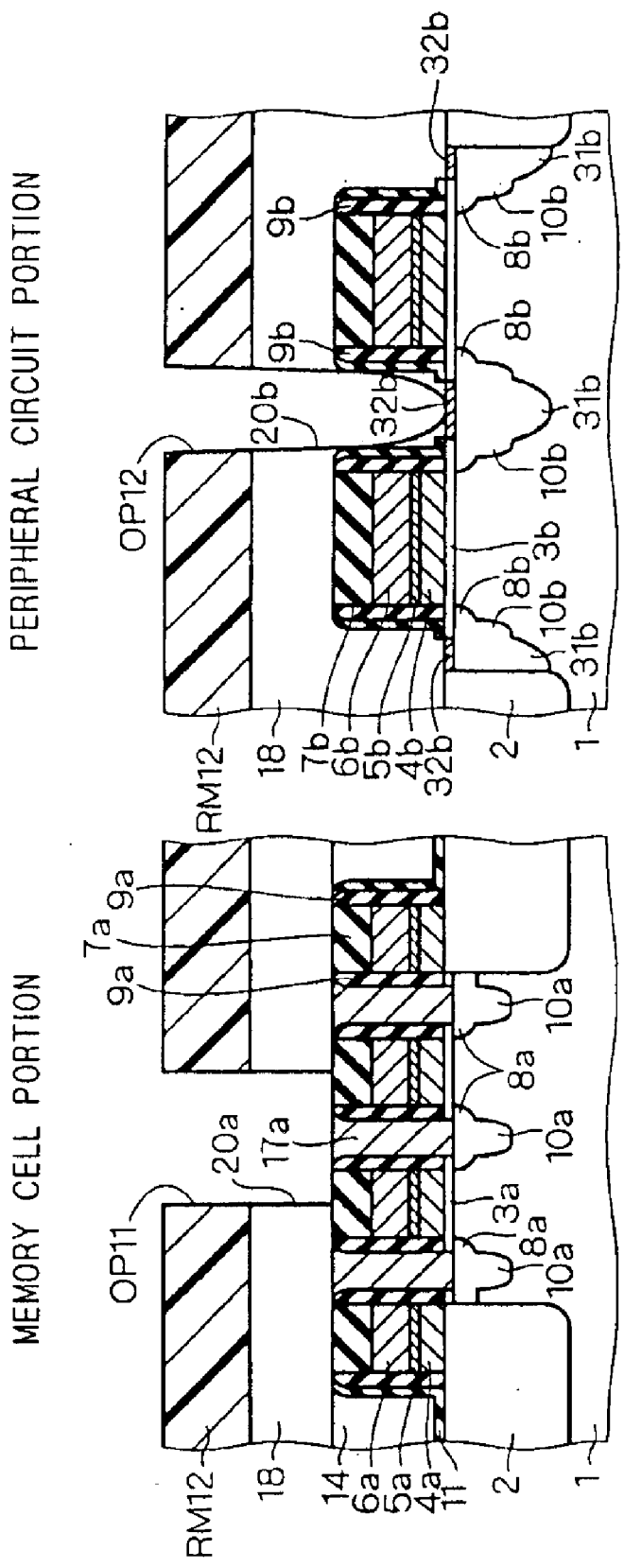
Figure 31:
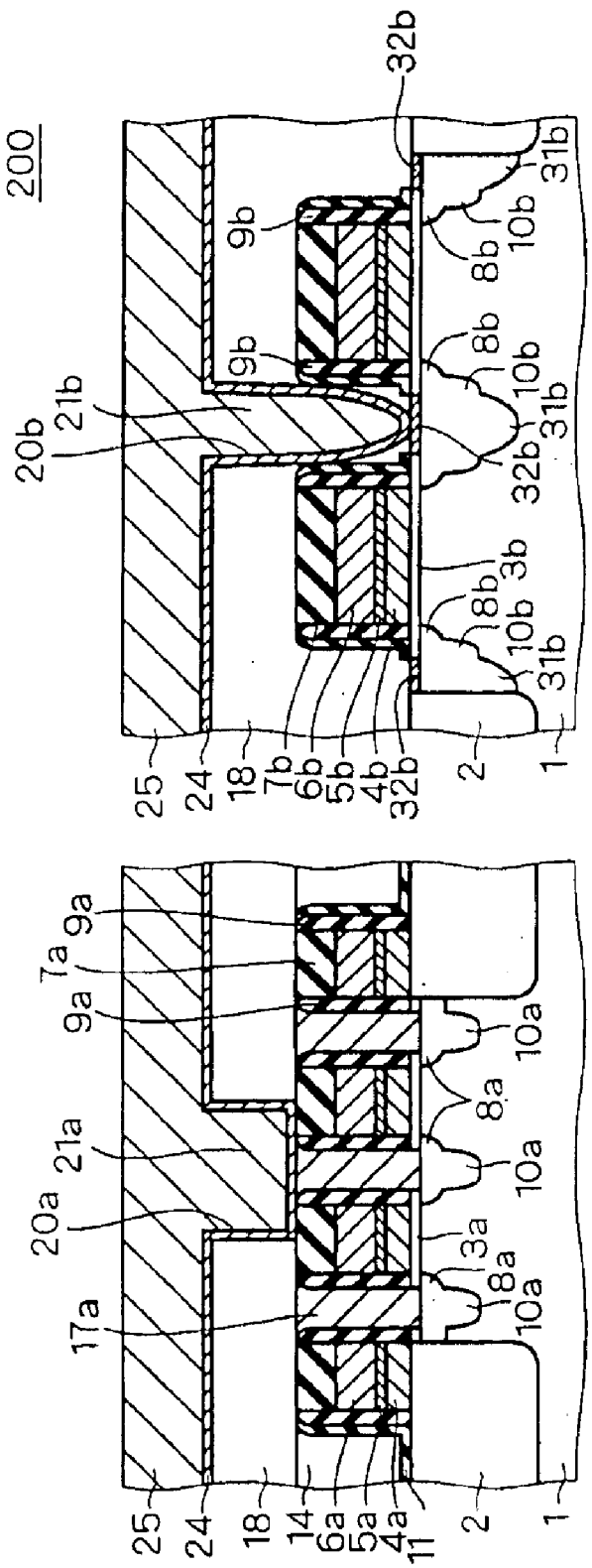

A method for manufacturing a DRAM 200 is described referring to the cross-sectional views of FIGS. 25 to 31 showing a sequence of manufacturing process steps. The structure of DRAM 200 is depicted in FIG. 31 that is used to describe the final process step. The same components described in the manufacturing method of DRAM 100 referring to FIGS. 1 to 16 are denoted by the same reference characters and are not described again here.

Through the process steps of FIGS. 1 to 11, the structure is obtained in which the interlayer insulating film 14 has been removed from the peripheral circuit portion in a self-aligned manner. At this stage, the insulating film 11, formed of a silicon nitride film, remains on the sides of the gate interconnections G2 and on top of the semiconductor substrate 1 in the peripheral circuit portion.

Figure 25:
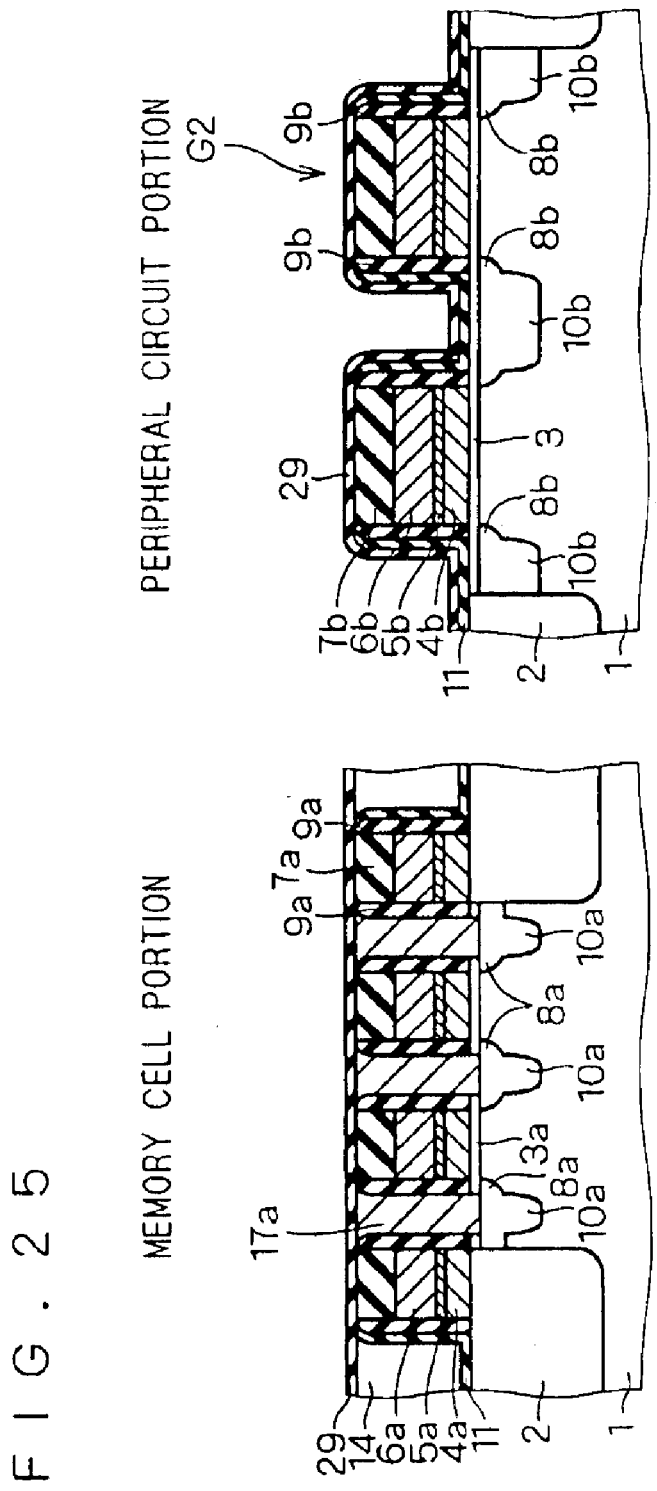
FIGS. 25 to 31 are cross-sectional views used to describe a sequence of process steps for manufacturing a semiconductor device according to a second preferred embodiment of the invention.

Then, in the process step of FIG. 25, a silicon oxide film 29, having a thickness of 5 nm to 100 nm, is deposited all over the semiconductor substrate 1, e.g. by CVD. Thus the memory cell portion is covered by the silicon oxide film 29; in the peripheral circuit portion, the silicon oxide film 29 forms further on the insulating film 11 to cover the gate interconnections G2.

Figure 26:
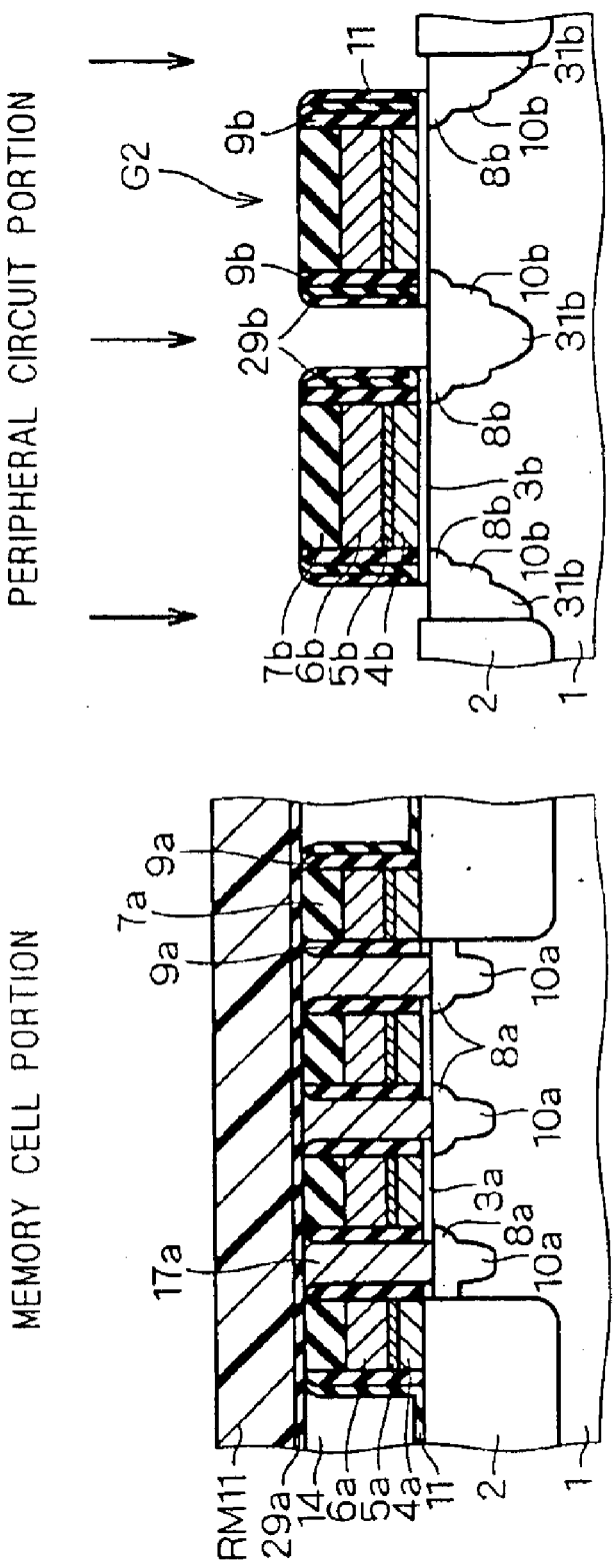

Next, in the process step of FIG. 26, at least the memory cell portion is covered by a resist mask RM11 and a whole-surface etch-back by dry-etching, e.g. RIE, is applied to the silicon oxide film 29. Thus, in the peripheral circuit portion, the silicon oxide film 29 remains as sidewall oxide films 29b (sidewall insulating films) on the outermost side surfaces of the gate interconnections G2.

During this process, the silicon oxide film 29, insulating film 11, and silicon oxide film 3 on the semiconductor substrate 1 are removed, so that, in the peripheral circuit portion, the surface of the semiconductor substrate 1, i.e. active regions, are exposed.

In the memory cell portion, the silicon oxide film 29, protected by the resist mask RM 11, remains as silicon oxide film 29a.

Subsequently, in the peripheral circuit portion, an impurity ion implantation with a dose of $1\times10^{15}$ to $1\times10^{16}$/cm$^2$ is performed to form source/drain regions 31b, using, as implant masks, the gate interconnections G2 having sidewall nitride films 9, insulating films 11 and sidewall oxide films 29 on their sides.

In this process, when N-channel MOS transistors are formed, phosphorus (P) is implanted at an energy of 35 keV to 45 keV, or arsenic (As) is implanted at an energy of 50 keV to 60 keV. When P-channel MOS transistors are formed, boron (B) is implanted at an energy of 5 keV to 10 keV, or boron difluoride (BF$_2$) is implanted at an energy of 20 keV to 30 keV.

This impurity ion implantation may be performed with the silicon oxide film 3, insulating film 11, and silicon oxide film 29 remaining on the semiconductor substrate 1 in the peripheral circuit portion, and the silicon oxide film 29, insulating filth 11 and silicon oxide film 3 are removed by anisotropic dry-etching.

While this dry-etching removes the silicon oxide film 3 exposed on the semiconductor substrate 1, the portions of silicon oxide film 3 covered by the gate interconnections G2 remain as gate insulating films 3b. Also, the insulating film 11 and silicon oxide films 29b remain on the sides of the gate interconnections G2.

Figure 27:
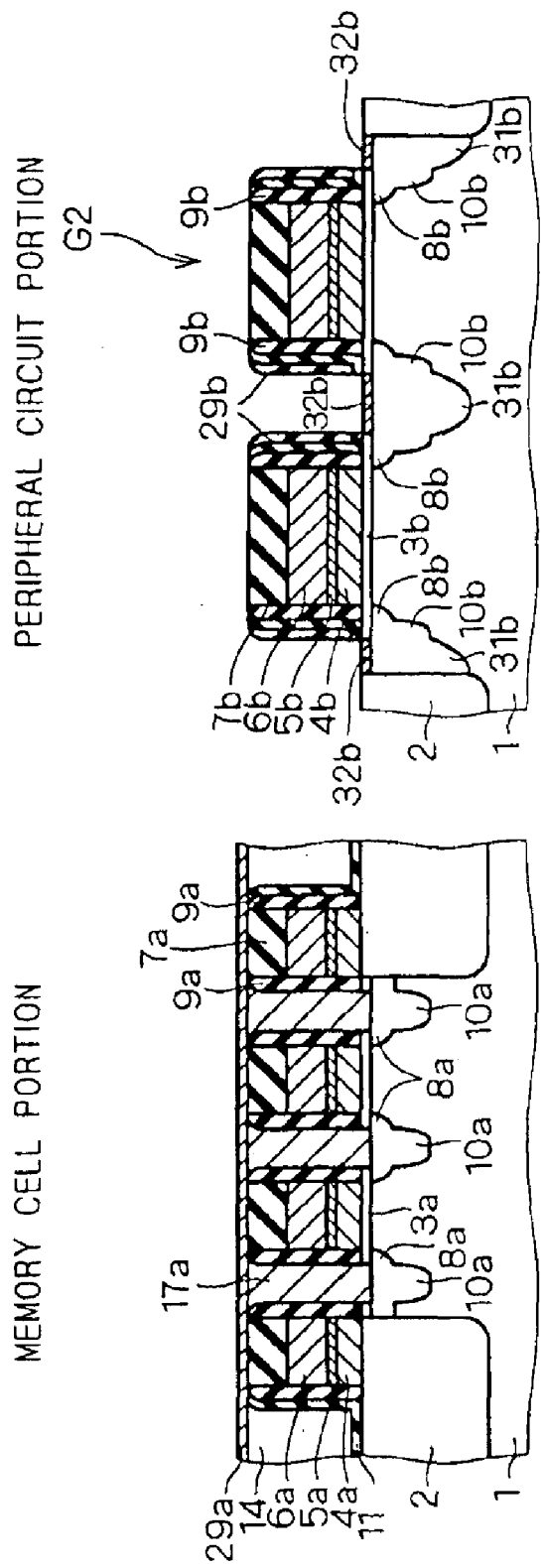

Next, after removal of the resist mask RM11, in the process step of FIG. 27, metal silicide films 32b are formed on the surface of the semiconductor substrate 1 exposed in the peripheral circuit portion, i.e. on the surfaces of active regions. Since the memory cell portion is covered by the silicon oxide film 29a, silicide reaction does not take place even when refractory metal is formed thereon and therefore metal silicide film does not form. Refractory metal formed on portions where silicide reaction does not take place, e.g. on silicon oxide and silicon nitride films, is removed.

Figure 28:
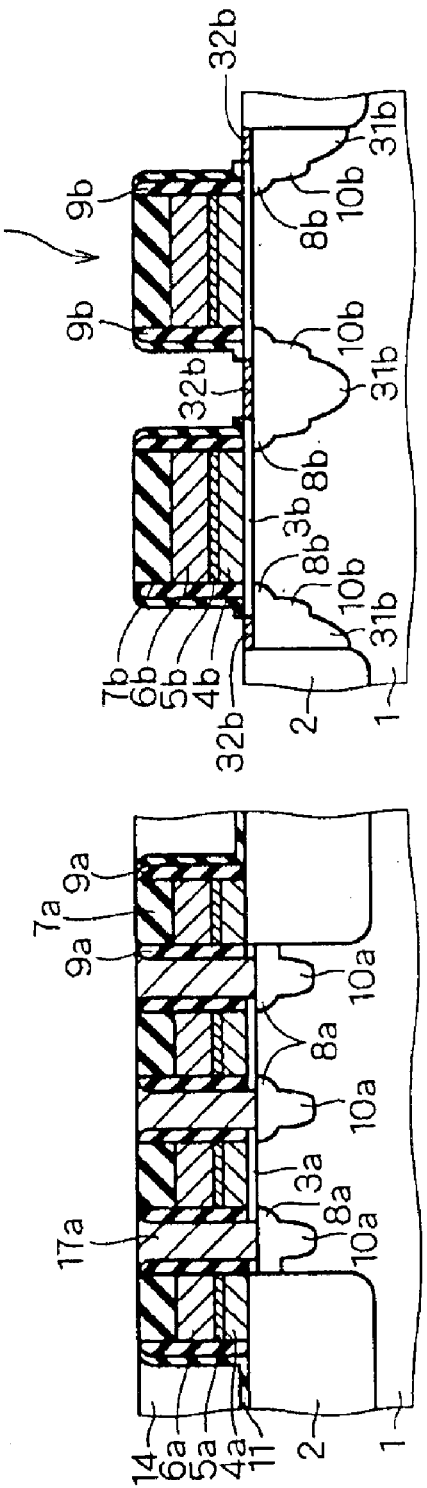

Next, in the process step of FIG. 28, the silicon oxide film 29a covering the memory cell portion and the silicon oxide films 29b on the outermost sides of the gate interconnections G2 in the peripheral circuit portion are removed by wet-etching using a solution, e.g. HF.

This process removes, together with silicon oxide films 29a and 29b, unwanted substances that may have been produced on the silicon oxide film 29 during the formation of metal silicide films 32b.

Next, in the process step of FIG. 29, a silicon oxide film, as an interlayer insulating film 18, is deposited all over the semiconductor substrate 1 by, e.g. CVD.

Subsequently, as shown in FIG. 30, a resist mask RM12 is formed, with openings OP11 and OP12 formed in areas where bit line contacts are to be formed in the memory cell portion and peripheral circuit portion. Then, using the resist mask RM12 as an etch mask, the interlayer insulating film 18 is selectively etched by dry-etching, e.g. RIE, to form contact openings 20a and 20b in the memory cell portion and peripheral circuit portion.

This etching process uses an etching that exhibits a large selectivity with respect to silicon nitride film and silicon film. Thus the contact opening 20a in the memory cell portion reaches contact plug 17a and the contact opening 20b in the peripheral circuit portion reaches metal silicide film 32b on the semiconductor substrate 1.

The contact openings 20a and 20b can be referred to as SAC contacts since they are obtained in a self-aligned manner, which relaxes resist mask positioning margin for contact formation and thus shortens the manufacturing process.

Next, in the process step of FIG. 31, metal films 24 and 25 are sequentially deposited all over the semiconductor substrate 1; the metal films 24 and 25 fill the contact openings 20a and 20b. Bit line contacts 21a and 21b are thus formed. Then, in order to form a desired bit line pattern, a resist mask patterning process by photolithography and a dry-etching process, e.g. RIE, using the resist mask are carried out to form desired bit lines; the main part of the DRAM 200 is thus completed.

B-2. Functions and Effects

In the above-described manufacturing method of the second preferred embodiment, the formation of source/drain regions 31b in the peripheral circuit portion described referring to FIG. 26 is performed after the formation of the interlayer insulating film 14 described referring to FIG. 6. Therefore, the peripheral circuit portion, after the formation of source/drain regions 31b, does not undergo the high-temperature (800° C. to 1000° C.) thermal process performed to improve the burying characteristics during the formation of interlayer insulating film 14.

Also, the formation of source/drain regions 31b in the peripheral circuit portion is performed after the formation of contact plugs 17a described referring to FIG. 10. Therefore, the peripheral circuit portion, after the formation of the source/drain regions 31b, does not undergo the high-temperature (800° C. to 1000° C.) thermal process performed to improve the refresh characteristics after the formation of contact plugs 17a.

Thus the source/drain regions 31b of MOS transistors in the peripheral circuit portion are not affected by high-temperature (800° C. to 1000° C.) thermal treatments, which suppresses reduction of punch-through margin of the MOS transistors in the peripheral circuit portion.

Also, as described referring to FIG. 26, in the peripheral circuit portion, the source/drain regions 31b are formed by impurity ion implantation using as implant masks the gate interconnections G2 that have sidewall nitride films 9, insulating films 11, and silicon oxide films 29 on their sides. Therefore the source/drain regions 31b of MOS transistors in the peripheral circuit portion are formed relatively away from the gate edges, which ensures still larger punch-through margin.

Moreover, in the peripheral circuit portion, as described with FIG. 27, the formation of metal silicide films 32b on the semiconductor substrate 1 not only reduces the contact resistance between bit line contacts 21b and active regions but also reduces the sheet resistance of the active regions, which enhances current driving capability of the peripheral circuit portion.

C. Third Preferred Embodiment

Next, a third preferred embodiment of the present invention is described referring to FIGS. 32 to 35.

C-1. Manufacturing Method

Figure 35:
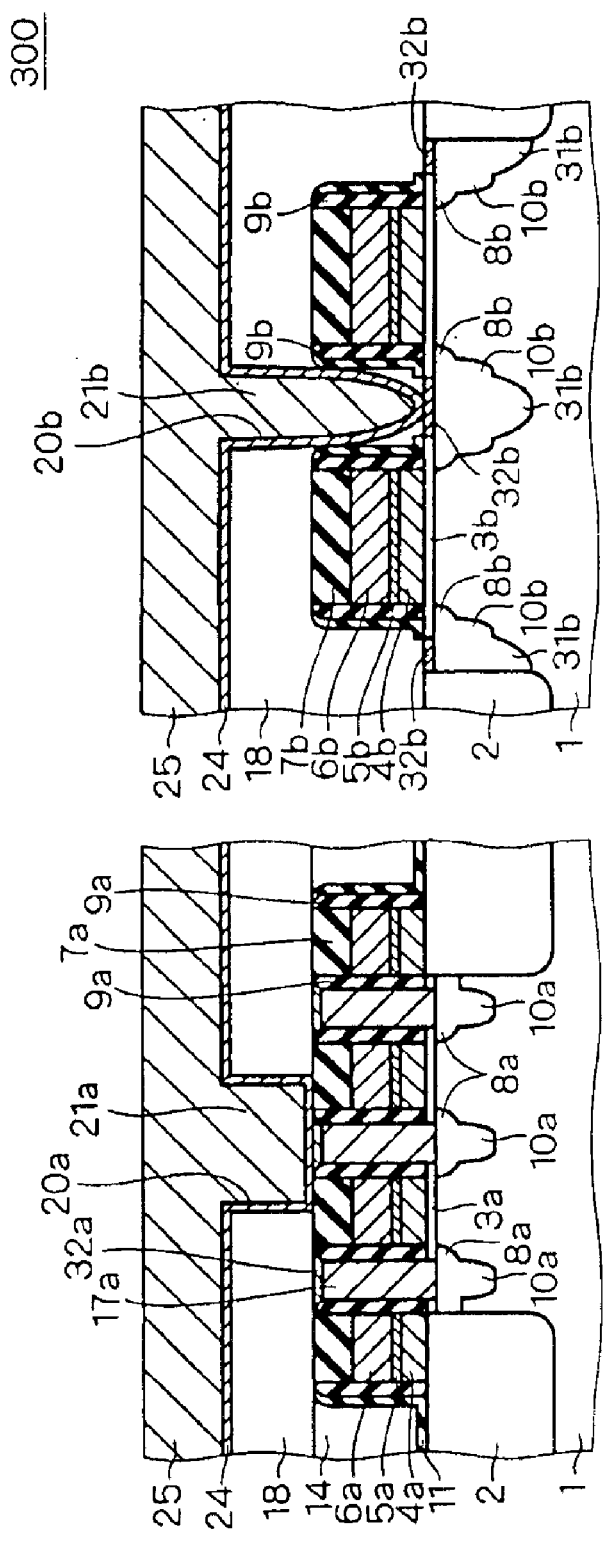

A method for manufacturing a DRAM 300 is described referring to the cross-sectional views of FIGS. 32 to 35 showing a sequence of manufacturing process steps. The structure of DRAM 300 is depicted in FIG. 35 that is used to describe the final process step. The same components described in the manufacturing method of DRAM 100 referring to FIGS. 1 to 16 are designated by the same reference characters and are not described again here.

Through the process steps described with FIGS. 1 to 11, the structure is obtained in which the interlayer insulating film 14 has been removed from the peripheral circuit portion in a self-aligned manner. At this stage, the insulating film 11, formed of a silicon nitride film, remains on the sides of the gate interconnections G2 and on top of the semiconductor substrate 1 in the peripheral circuit portion.

Then, through the process step shown in FIG. 25, a silicon oxide film 29, having a thickness of 5 nm to 100 nm, is deposited all over the semiconductor substrate 1.

Figure 32:
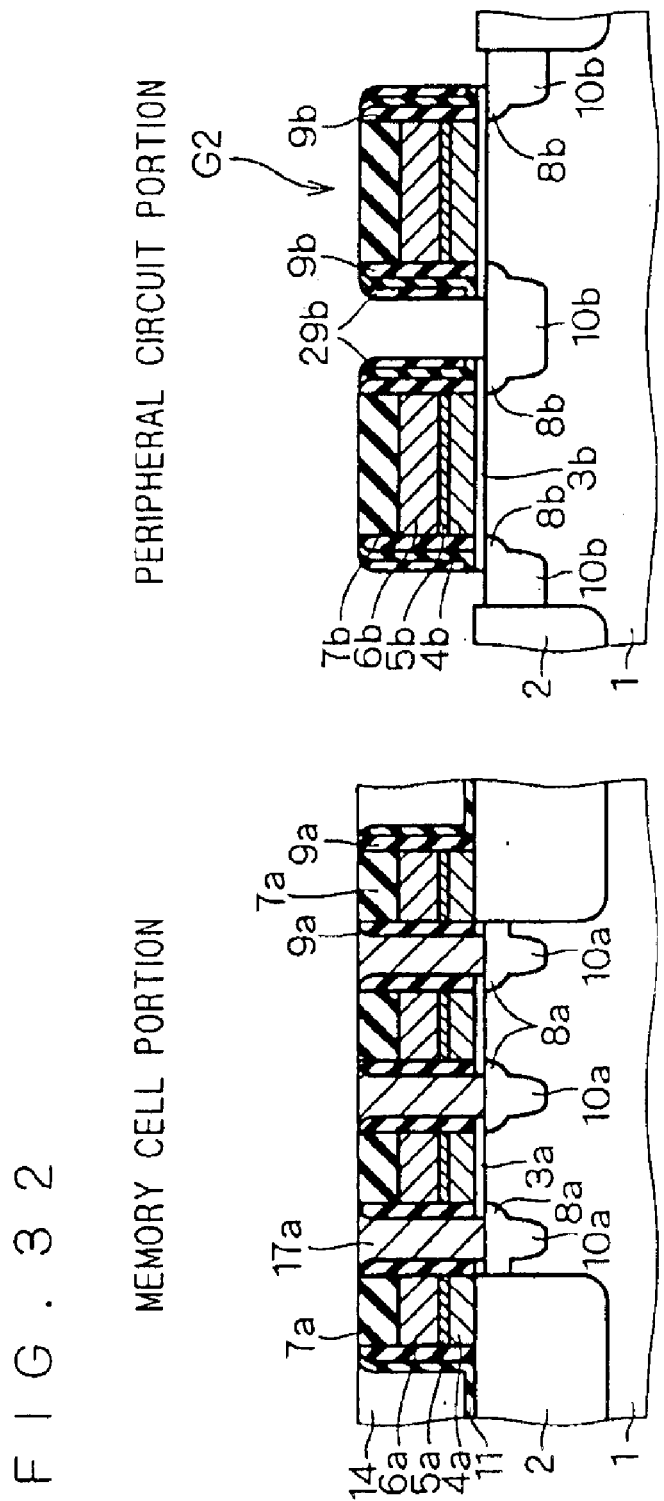

Next, in the process step of FIG. 32, a whole-surface etch-back, by dry-etching, e.g. RIE, is applied to the silicon oxide film 29. Thus, in the memory cell portion, contact plugs 17a are exposed, and in the peripheral circuit portion, the silicon oxide film 29 remains as sidewall oxide films 29b on the outermost side surfaces of the gate interconnections G2.

During this process, the silicon oxide film 29, insulating film 11, and silicon oxide film 3 on the semiconductor substrate 1 are removed, so that, in the peripheral circuit portion, the surface of the semiconductor substrate 1, i.e. active regions, are exposed.

This dry-etching removes the portions of the silicon oxide film 3 that are exposed on the semiconductor substrate 1, but the portions of the silicon oxide film 3 that are covered by the gate interconnections G2 remain as gate insulating films 3b.

Subsequently, in the process step of FIG. 33, at least the memory cell portion is covered with resist mask RM21, and an impurity ion implantation with a dose of $1 \times 10^{15}$ to $1 \times 10^{16}/cm^2$ is applied to the peripheral circuit portion, using, as implant masks, the gate interconnections G2 having sidewall nitride films 9, insulating films 11, and sidewall oxide films 29b on their sides, whereby source/drain regions 31b are formed.

In this process, when N-channel MOS transistors are formed, phosphorus (P) is implanted at an energy of 35 keV to 45 keV, or arsenic (As) is implanted at an energy of 50 keV to 60 keV. When P-channel MOS transistors are formed, boron (B) is implanted at an energy of 5 keV to 10 keV, or boron difluoride ($BF_2$) is implanted at an energy of 20 keV to 30 keV.

Next, after removal of the resist mask RM21, in the process step of FIG. 34, metal silicide films 32a and 32b are formed respectively on the surfaces of the contact plugs 17a that are exposed in the memory cell portion and on the surface of the semiconductor substrate 1 exposed in the peripheral circuit portion, i.e. on the surfaces of active regions.

Subsequently, the silicon oxide films 29b on the outermost side surfaces of the gate interconnections G2 in the peripheral circuit portion are removed by a wet-etching using a solution, e.g. HF. During this process, the memory cell portion may be covered with a resist mask (not shown) to protect the interlayer insulating film 14 from being etched.

Then, through process steps as shown in FIGS. 29 and 30, a silicon oxide film as an interlayer insulating film 18 is deposited all over the semiconductor substrate 1 and then contact openings 20a and 20b are formed in areas where bit line contacts are to be formed in the memory cell portion and peripheral circuit portion.

Thus the contact opening 20a in the memory cell portion is formed to reach metal silicide film 32a on contact plug 17a and the contact opening 20b in the peripheral circuit portion is formed to reach metal silicide film 32b on the semiconductor substrate 1.

The contact openings 20a and 20b can be referred to as SAC contacts since they are obtained in a self-aligned manner, which relaxes resist mask positioning margin for contact formation and thus shortens the manufacturing process.

Next, in the process step of FIG. 35, metal films 24 and 25 are sequentially deposited all over the semiconductor substrate 1; the metal films 24 and 25 fill the contact openings 20a and 20b. Bit line contacts 21a and 21b are thus formed. Then, in order to form a desired bit line pattern, a resist mask patterning process by photolithography and a dry-etching process, e.g. RIE, using the resist mask are carried out to form desired bit lines; thus the main part of the DRAM 300 is completed.

C-2. Functions and Effects

In the above-described manufacturing method of the third preferred embodiment, the formation of source/drain regions 31b in the peripheral circuit portion described referring to FIG. 33 is performed after the formation of interlayer insulating film 14 described referring to FIG. 6. Therefore, the peripheral circuit portion, after the formation of source/drain regions 31b, does not experience the high-temperature (800° C. to 1000° C.) thermal process performed to improve the burying characteristics during the formation of interlayer insulating film 14.

Also, the formation of source/drain regions 31b in the peripheral circuit portion is performed after the formation of contact plugs 17a described referring to FIG. 10. Therefore, the peripheral circuit portion, after the formation of source/drain regions 31b, does not experience the high-temperature (800° C. to 1000° C.) thermal process performed to improve the refresh characteristics after the formation of contact plugs 17a.

Thus the source/drain regions 31b of MOS transistors in the peripheral circuit portion are not affected by high-temperature (800° C. to 1000° C.) thermal treatments, which suppresses reduction of punch-through margin of the MOS transistors in the peripheral circuit portion.

Also, in the peripheral circuit portion, as described referring to FIG. 33, the source/drain regions 31b are formed by impurity ion implantation using as implant masks the gate interconnections G2 having sidewall nitride films 9, insulating films 11, and silicon oxide films 29b on their sides. Therefore the source/drain regions 31b of MOS transistors in the peripheral circuit portion are formed relatively away from the gate edges, which ensures still larger punch-through margin.

Furthermore, in the memory cell portion, the formation of metal silicide films 32a on the top surfaces of all contact plugs 17a lowers the contact resistance of bit line contacts 21a and storage node contacts (not shown).

In particular, storage node contacts that connect bit line contacts 21a and storage nodes (not shown) of storage capacitors formed above the bit lines have a large aspect ratio of opening depth to width, so that it is difficult to form silicide film at the hole bottoms after formation of openings. However, the metal silicide films 32a formed on top surfaces of contact plugs 17a reduces the contact resistance of the storage node contacts.

Moreover, in the peripheral circuit portion, the formation of metal silicide films 32b on the semiconductor substrate 1 not only reduces the contact resistance between bit line contacts 21b and active regions but also reduces the sheet resistance of the active regions, which enhances current driving capability of the peripheral circuit portion.

D. Fourth Preferred Embodiment

Next, a fourth preferred embodiment of the present invention is described referring to FIGS. 36 to 41.

D-1. Manufacturing Method

A method for manufacturing a DRAM 400 is described referring to the cross-sectional views of FIGS. 36 to 41 showing a sequence of manufacturing process steps. The structure of DRAM 400 is depicted in FIG. 41 that is used to describe the final process step. The same components described in the manufacturing method of DRAM 100 referring to FIGS. 1 to 16 are designated by the same reference characters and are not described again here.

Through the process steps of FIGS. 1 to 11, the structure is obtained in which the interlayer insulating film 14 has been removed from the peripheral circuit portion in a self-aligned manner. At this stage the insulating film 11, formed of a silicon nitride film, remains on the sides of the gate interconnections G2 and on top of the semiconductor substrate 1 in the peripheral circuit portion.

Then, in the process step of FIG. 36, a silicon nitride film 28, having a thickness of 5 nm to 100 nm, is deposited all over the semiconductor substrate 1 by e.g. CVD. Thus the memory cell portion is covered by the silicon nitride film 28; in the peripheral circuit portion, the silicon nitride film 28 forms further on the insulating film 11 to cover the gate interconnections G2.

Figure 37:
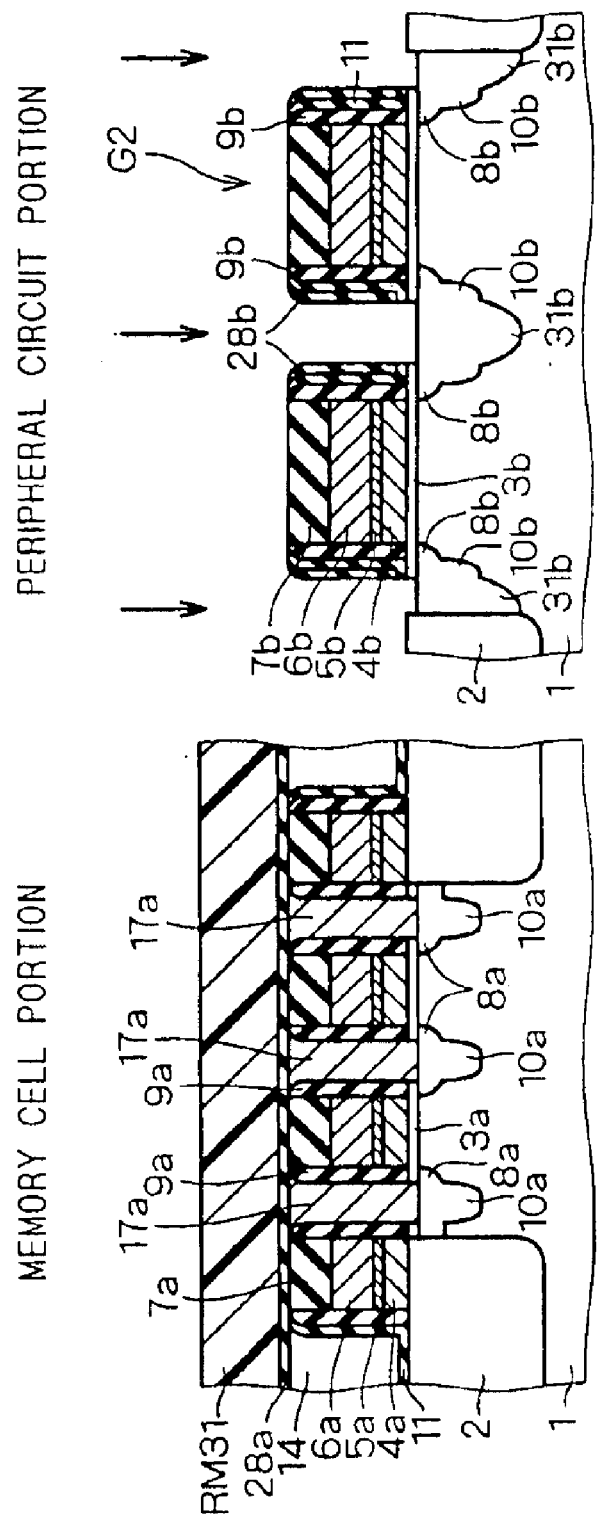

Next, in the process step of FIG. 37, at least the memory cell portion is covered by a resist mask RM31 and a whole-surface etch-back by dry-etching, e.g. RIE, is applied to the silicon nitride film 28. Thus, in the peripheral circuit portion, the silicon nitride film 28 remains as sidewall nitride films 28b (sidewall insulating films, second sidewall nitride films) on the outermost side surfaces of the gate interconnections G2.

During this process, the silicon nitride film 28, insulating film 11, and silicon oxide film 3 on the semiconductor substrate 1 are removed, so that, in the peripheral circuit portion, the surface of the semiconductor substrate 1, i.e. active regions, are exposed.

In the memory cell portion, the silicon nitride film 28, protected by the resist mask RM31, remains as silicon nitride film 28a.

While this dry-etching removes the silicon oxide film 3 exposed on the semiconductor substrate 1, the portions of silicon oxide film 3 covered by the gate interconnections G2 remain as gate insulating films 3b.

Subsequently, in the peripheral circuit portion, an impurity ion implantation with a dose of $1 \times 10^{15}$ to $1 \times 10^{16}/cm^2$ is performed to form source/drain regions 31b, using, as implant masks, the gate interconnections G2 having sidewall nitride films 9, insulating films 11 and sidewall nitride films 28b on their sides.

In this process, when N-channel MOS transistors are formed, phosphorus (P) is implanted at an energy of 35 keV to 45 keV, or arsenic (As) is implanted at an energy of 50 keV to 60 keV. When P-channel MOS transistors are formed, boron (B) is implanted at an energy of 5 keV to 10 keV, or boron difluoride ($BF_2$) is implanted at an energy of 20 keV to 30 keV.

This impurity ion implantation may be performed with the silicon oxide film 3, insulating film 11 and silicon nitride film 28 remaining on the semiconductor substrate 1 in the peripheral circuit portion and then the silicon nitride film 28, insulating film 11, and silicon oxide film 3 are removed by anisotropic dry-etching.

Figure 38:
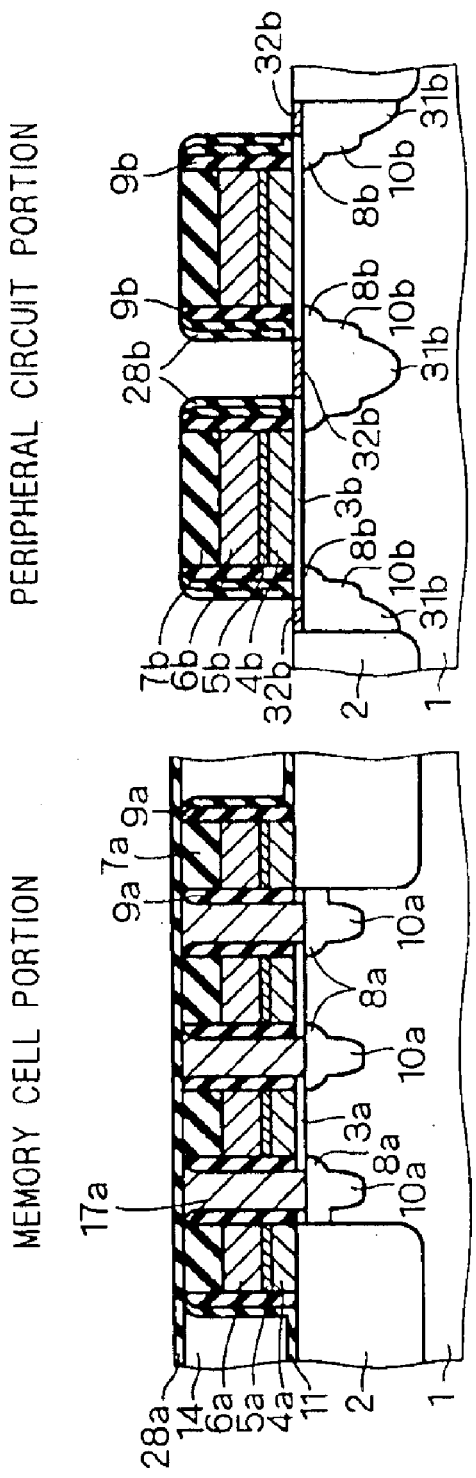

Next, in the process step of FIG. 38, after removal of the resist mask RM31, metal silicide films 32b are formed on the surface of the semiconductor substrate 1 exposed in the peripheral circuit portion, i.e. on the surfaces of active regions. Since the memory cell portion is covered by the silicon nitride film 28a, silicide reaction does not take place even when refractory metal is formed thereon and therefore no metal silicide film forms. Refractory metal formed on portions where silicide reaction does not take place, e.g. on silicon oxide and silicon nitride films, is removed.

Figure 39:
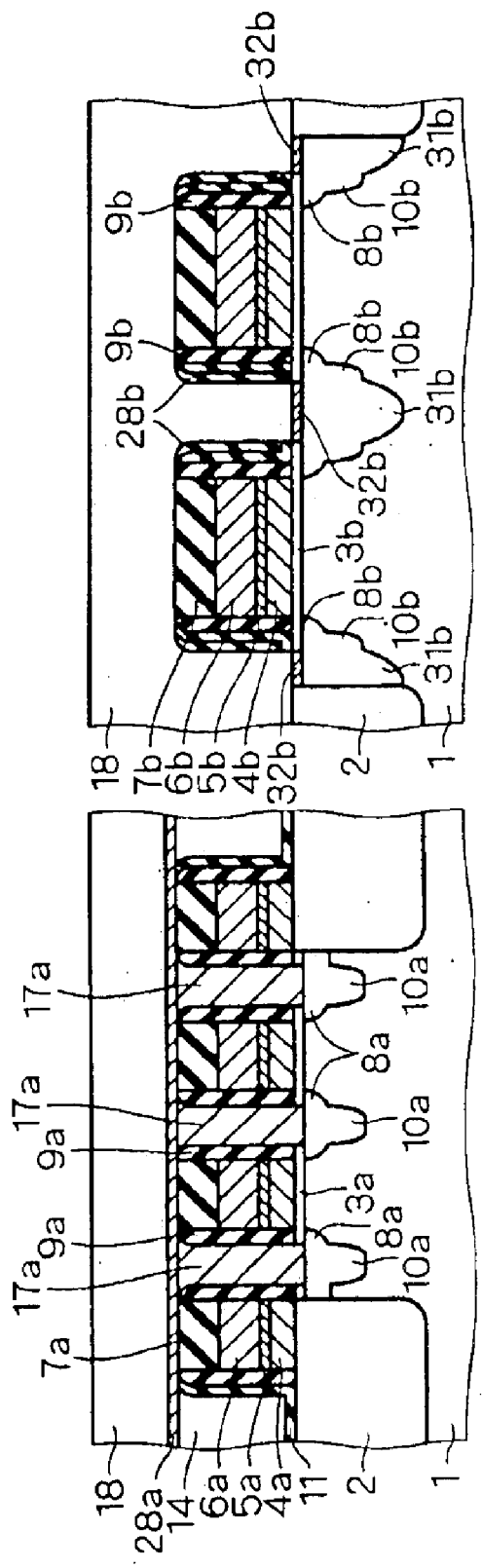

Next, in the process step of FIG. 39, a silicon oxide film, as an interlayer insulating film 18, is deposited all over the semiconductor substrate 1, e.g. by CVD.

Figure 40:
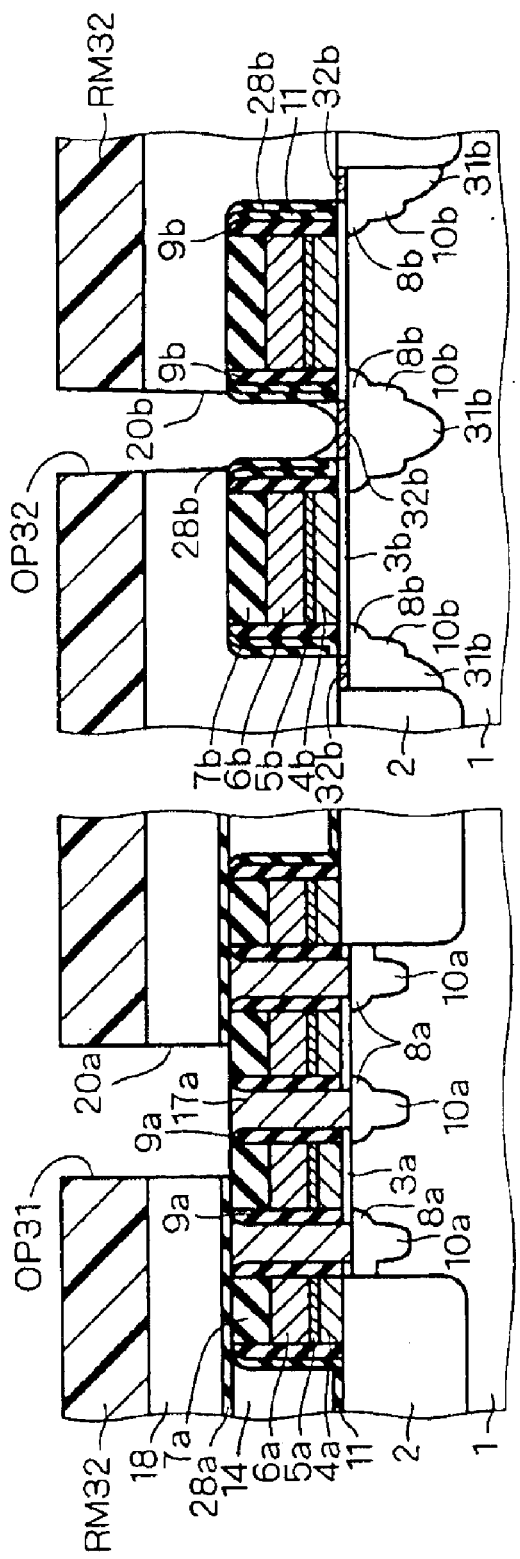

Subsequently, as shown in FIG. 40, a resist mask RM32 is formed, with openings OP31 and OP32 in areas where bit line contacts are to be formed in the memory cell portion and peripheral circuit portion. Then, using the resist mask RM32 as an etch mask, the interlayer insulating film 18 is selectively etched by dry-etching, e.g. RIE, to form contact openings 20a and 20b in the memory cell portion and peripheral circuit portion.

This etching process uses an etching that exhibits a large selectivity with respect to silicon nitride film and silicon film. Thus the contact opening 20a in the memory cell portion is formed to reach contact plug 17a and the contact opening 20b in the peripheral circuit portion is formed to reach metal silicide film 32b on the semiconductor substrate 1.

The contact openings 20a and 20b can be referred to as SAC contacts since they are obtained in a self-aligned manner, which relaxes resist mask positioning margin for contact formation and thus shortens the manufacturing process.

During this process, in the memory cell portion, since the silicon nitride film 28a resides on top of the memory cell portion, the etching can be stopped in the middle of silicon nitride film 28a. It is therefore possible to remove the silicon nitride film 28a later under different conditions so as to reduce the amount of etch of the protective insulating film 7 formed of, e.g. silicon nitride film, on the gate interconnections G1. This makes it possible to suppress reduction of short margin between the gate interconnections G1 and bit line contacts formed later.

Next, in the process step of FIG. 41, metal films 24 and 25 are sequentially deposited all over the semiconductor substrate 1; the metal films 24 and 25 fill the contact openings 20a and 20b. Bit line contacts 21a and 21b are thus formed. Then, in order to form a desired bit line pattern, a resist mask patterning process by photolithography and a dry-etching process, e.g. RIE, using the resist mask are carried out to form desired bit lines; thus the main part of the DRAM 400 is completed.

D-2. Functions and Effects

In the above-described manufacturing method of the fourth preferred embodiment, the formation of source/drain regions 31b in the peripheral circuit portion described referring to FIG. 37 is performed after the formation of the interlayer insulating film 14 described referring to FIG. 6. Therefore, the peripheral circuit portion, after the formation of source/drain regions 31b, does not undergo the high-temperature (800° C. to 1000° C.) thermal process performed to improve the burying characteristics during the formation of interlayer insulating film 14.

Also, the formation of source/drain regions 31b in the peripheral circuit portion is performed after the formation of contact plugs 17a described referring to FIG. 10. Therefore, the peripheral circuit portion, after the formation of source/drain regions 31b, does not undergo the high-temperature (800° C. to 1000° C.) thermal process performed to improve the refresh characteristics after the formation of contact plugs 17a.

Thus the source/drain regions 31b of MOS transistors in the peripheral circuit portion are not affected by high-temperature (800° C. to 1000° C.) thermal treatments, which suppresses reduction of punch-through margin of the MOS transistors in the peripheral circuit portion.

Also, in the peripheral circuit portion, as described referring to FIG. 37, the source/drain regions 31b are formed by impurity ion implantation using as implant masks the gate interconnections G2 having sidewall nitride films 9, insulating films 11, and sidewall nitride films 28b on their sides. Therefore the source/drain regions 31b of MOS transistors in the peripheral circuit portion are formed relatively away from the gate edges, which ensures still larger punch-through margin.

Moreover, in the peripheral circuit portion, the formation of metal silicide films 32b on the semiconductor substrate 1 not only reduces the contact resistance between bit line contacts 21b and active regions but also reduces the sheet resistance of the active regions, which enhances current driving capability of the peripheral circuit portion.

Furthermore, as described referring to FIG. 40, in the peripheral circuit portion, the contact opening 20b is formed, with the sidewall nitride films 9, insulating films 11 and sidewall nitride films 28b remaining on the sides of the gate interconnections G2. The width of the gate interconnections G2 can therefore be larger to increase short margin between bit line contact 21b and gate interconnections G2.

E. Fifth Preferred Embodiment

Next, a fifth preferred embodiment of the present invention is described referring to FIGS. 42 to 45.

E-1. Manufacturing Method

Figure 45:
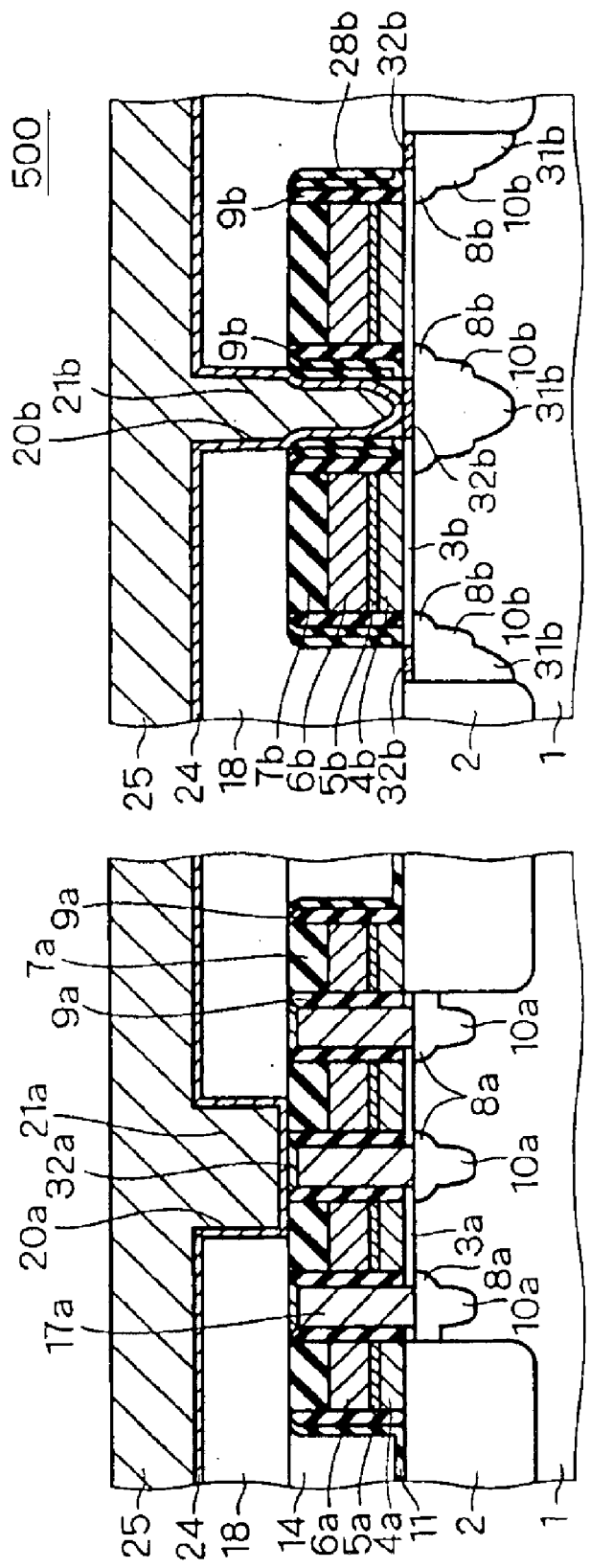

A method for manufacturing a DRAM 500 is described referring to the cross-sectional views of FIGS. 42 to 45 showing a sequence of manufacturing process steps. The structure of DRAM 500 is depicted in FIG. 45 that is used to describe the final process step. The same components described in the manufacturing method of DRAM 100 referring to FIGS. 1 to 16 are designated by the same reference characters and are not described again here.

Through the process steps of FIGS. 1 to 11, the structure is obtained in which the interlayer insulating film 14 has been removed from the peripheral circuit portion in a self-aligned manner. At this stage the insulating film 11, formed of a silicon nitride film, remains on the sides of the gate interconnections G2 and on top of the semiconductor substrate 1 in the peripheral circuit portion.

Then, through a process as shown in FIG. 36, a silicon nitride film 28, having a thickness of 5 nm to 100 nm, is deposited all over the semiconductor substrate 1 by, e.g. CVD. Thus the memory cell portion is covered by the silicon nitride film 28; in the peripheral circuit portion, the silicon nitride film 28 forms further on the insulating film 11 to cover the gate interconnections G2.

Next, in the process step of FIG. 42, a whole-surface etch-back, by dry-etching, e.g. RIE, is applied to the silicon nitride film 28. Thus, the contact plugs 17a are exposed in the memory cell portion, and in the peripheral circuit portion, the silicon nitride film 28 remains as sidewall nitride films 28b on the outermost side surfaces of the gate interconnections G2.

During this process, the silicon nitride film 28, insulating film 11, and silicon oxide film 3 on the semiconductor substrate 1 are removed, so that, in the peripheral circuit portion, the surface of the semiconductor substrate 1, i.e. active regions, are exposed.

While this dry-etching removes the silicon oxide film 3 exposed on the semiconductor substrate 1, the portions of silicon oxide film 3 covered by the gate interconnections G2 remain as gate insulating films 3b.

Subsequently, in the process step of FIG. 43, at least the memory cell portion is covered by a resist mask RM41 and an impurity ion implantation with a dose of $1 \times 10^{15}$ to $1 \times 10^{16}/cm^2$ is applied to the peripheral circuit portion, using, as implant masks, the gate interconnections G2 having sidewall nitride films 9, insulating films 11, and sidewall nitride films 28b on their sides, whereby source/drain regions 31b are formed.

In this process, when N-channel MOS transistors are formed, phosphorus (P) is implanted at an energy of 35 keV to 45 keV, or arsenic (As) is implanted at an energy of 50 keV to 60 keV. When P-channel MOS transistors are formed, boron (B) is implanted at an energy of 5 keV to 10 keV, or boron difluoride ($BF_2$) is implanted at an energy of 20 keV to 30 keV.

Next, after removal of the resist mask RM41, in the process step of FIG. 44, metal silicide films 32a and 32b are formed respectively on the surfaces of contact plugs 17a exposed in the memory cell portion and on the surface of the semiconductor substrate 1 exposed in the peripheral circuit portion, i.e. on the surfaces of active regions.

Then, through process steps as illustrated in FIGS. 29 and 30, a silicon oxide film is deposited as an interlayer insulating film 18 all over the semiconductor substrate 1 and contact openings 20a and 20b are formed in areas where bit line contacts are formed in the memory cell portion and peripheral circuit portion.

The contact openings 20a and 20b can be referred to as SAC contacts since they are obtained in a self-aligned manner, which relaxes resist mask positioning margin for contact formation and thus shortens the manufacturing process.

Thus the contact opening 20a in the memory cell portion reaches metal silicide film 32a on contact plug 17a and the contact opening 20b in the peripheral circuit portion reaches metal silicide film 32b on the semiconductor substrate 1.

Next, in the process step of FIG. 45, metal films 24 and 25 are sequentially deposited all over the semiconductor substrate 1; the metal films 24 and 25 fill the contact openings 20a and 20b. Bit line contacts 21a and 21b are thus formed. Then, in order to form a desired bit line pattern, a resist mask patterning process by photolithography and a dry-etching process, e.g. RIE, using the resist mask are carried out to form desired bit lines; thus the main part of the DRAM 500 is completed.

E-2. Functions and Effects

Figure 43:
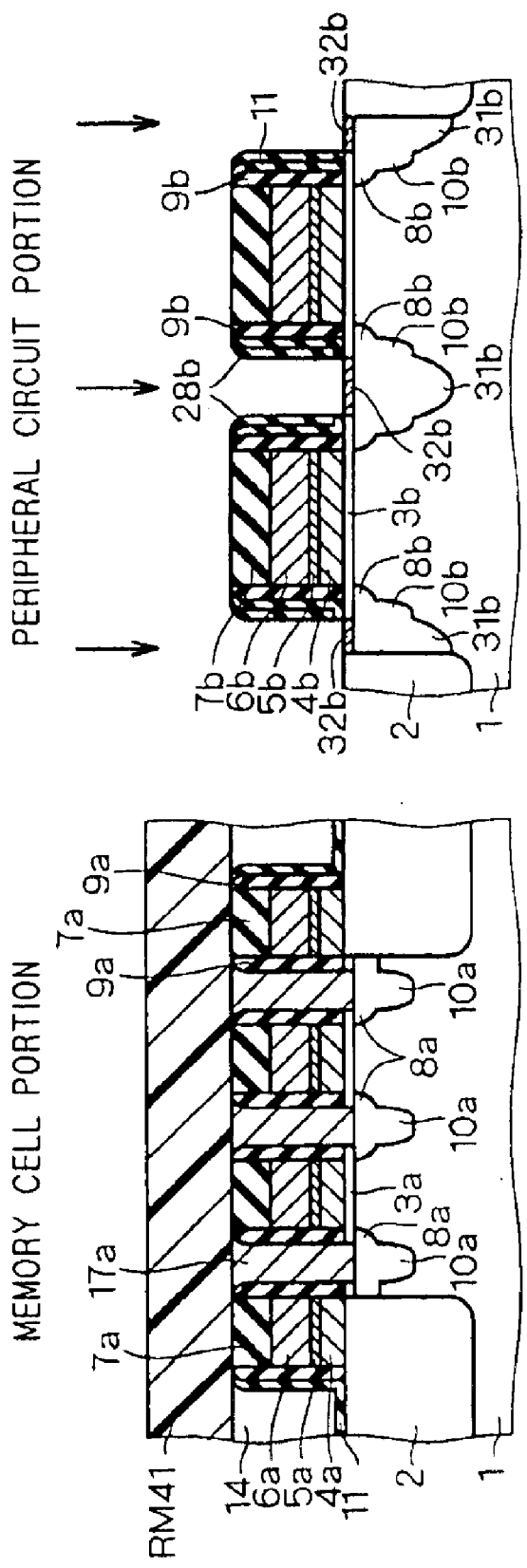

In the above-described manufacturing method of the fifth preferred embodiment, the formation of source/drain regions 31b in the peripheral circuit portion described referring to FIG. 43 is performed after the formation of the interlayer insulating film 14 described referring to FIG. 6. Therefore, after the formation of source/drain regions 31b, the peripheral circuit portion does not experience the high-temperature (800° C. to 1000° C.) thermal process performed to improve the burying characteristics during the formation of interlayer insulating film 14.

Also, the formation of source/drain regions 31b in the peripheral circuit portion is performed after the formation of contact plugs 17a described referring to FIG. 10. Therefore, after the formation of source/drain regions 31b, the peripheral circuit portion does not experience the high-temperature (800° C. to 1000° C.) thermal process performed to improve the refresh characteristics after the formation of contact plugs 17a.

Thus the source/drain regions 31b of MOS transistors in the peripheral circuit portion are not affected by high-temperature (800° C. to 1000° C.) thermal treatments, which suppresses reduction of punch-through margin of the MOS transistors in the peripheral circuit portion.

Also, in the peripheral circuit portion, as described referring to FIG. 43, the source/drain regions 31b are formed by impurity ion implantation using as implant masks the gate interconnections G2 having sidewall nitride films 9, insulating films 11, and sidewall nitride films 28b on their sides. Therefore the source/drain regions 31b of MOS transistors in the peripheral circuit portion are formed relatively away from the gate edges, which ensures still larger punch-through margin.

Furthermore, in the memory cell portion, metal silicide films 32a are formed on all contact plugs 17a, which lowers the contact resistance of bit line contacts 21a and storage node contacts (not shown).

In particular, storage node contacts that connect bit line contacts 21a and storage nodes (not shown) of storage capacitors formed above the bit lines have a large aspect ratio of opening depth to width, so that it is difficult to form silicide film at the hole bottoms after formation of openings. However, the metal silicide films 32a formed on top surfaces of the contact plugs 17a reduce the contact resistance of the storage node contacts.

Moreover, in the peripheral circuit portion, the formation of metal silicide films 32b on the semiconductor substrate 1 not only reduces the contact resistance between bit line contacts 21b and active regions but also reduces the sheet resistance of active regions, which enhances current driving capability of the peripheral circuit portion.

Furthermore, in the peripheral circuit portion, the contact opening 20b is formed, with the sidewall nitride films 9, insulating films 11, and sidewall nitride films 28b remaining on the sides of gate interconnections G2. Therefore the width of the gate interconnections G2 can be larger to increase the short margin between bit line contacts 21b and gate interconnections G2.

F. Sixth Preferred Embodiment

Next, a sixth preferred embodiment of the present invention is described referring to FIGS. 46 to 52.

F-1. Manufacturing Method

Figure 50:
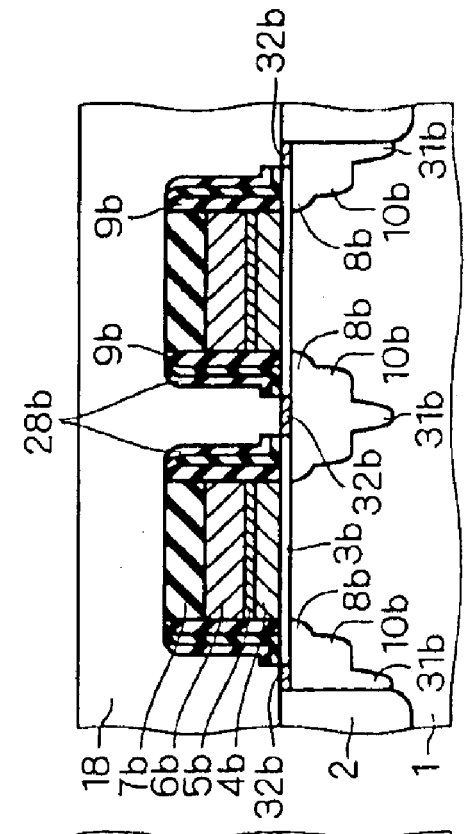
Figure 51:
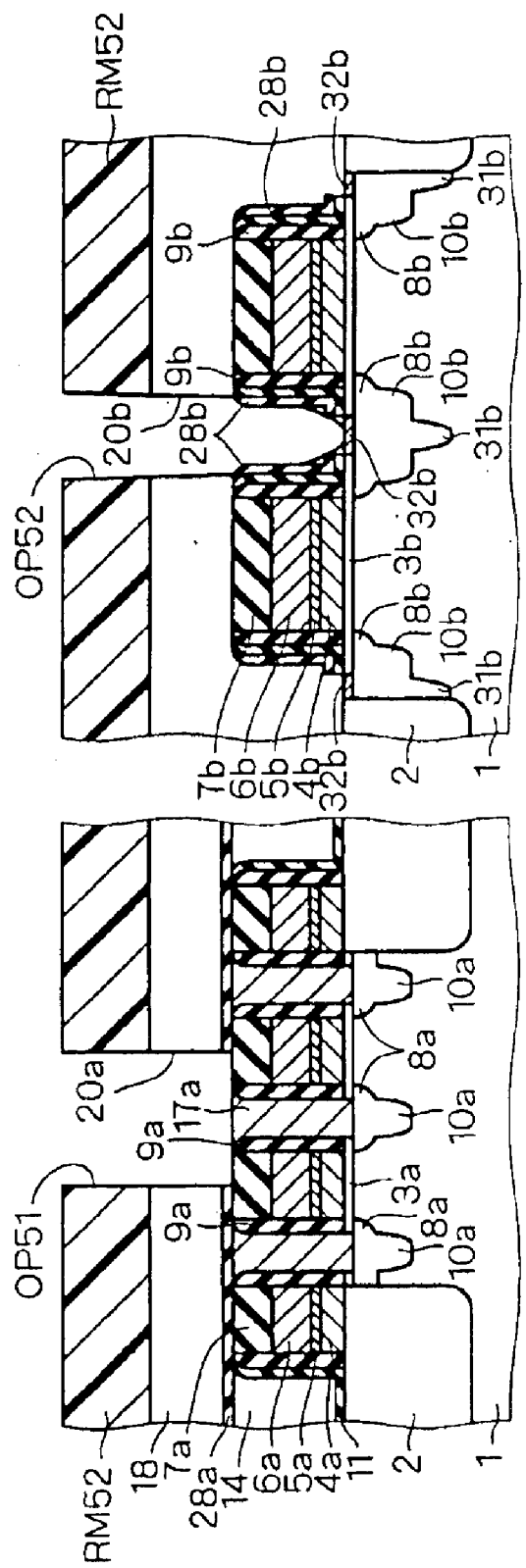
Figure 52:
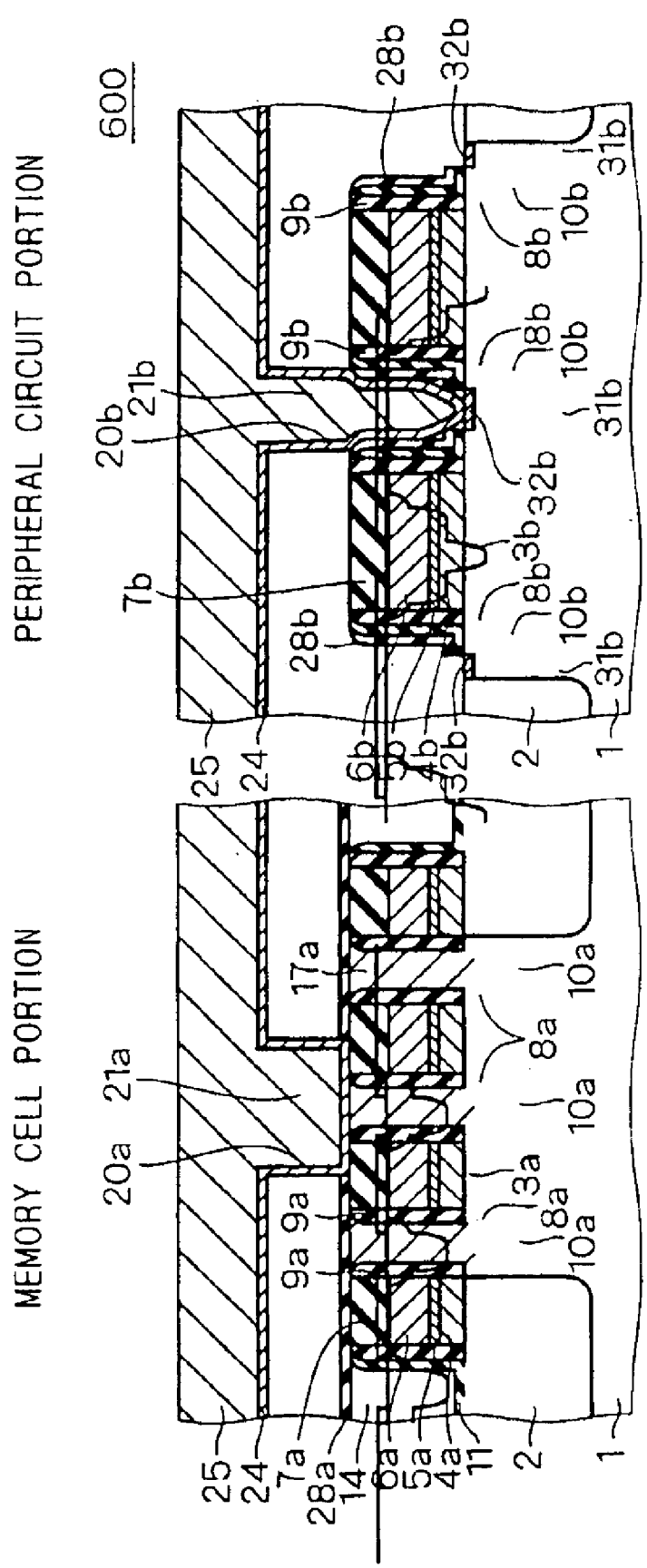

A method for manufacturing a DRAM 600 is described referring to the cross-sectional views of FIGS. 46 to 52 showing the sequence of manufacturing process steps. The structure of DRAM 600 is shown in FIG. 52 that depicts the final process step. The same components described in the manufacturing method of DRAM 100 referring to FIGS. 1 to 16 are designated by the same reference characters and are not described again here.

Through the process steps of FIGS. 1 to 11, the structure is obtained in which the interlayer insulating film 14 has been removed from the peripheral circuit portion in a self-aligned manner. At this stage the insulating film 11, formed of a silicon nitride film, remains on the sides of the gate interconnections G2 and on top of the semiconductor substrate 1 in the peripheral circuit portion.

Then, through a process as illustrated in FIG. 36, a silicon nitride film 28, having a thickness of 5 nm to 100 nm, is deposited all over the semiconductor substrate 1 by, e.g. CVD. Then, in the process step shown in FIG. 46, a silicon oxide film 29 having a thickness of 5 nm to 100 nm is deposited by, e.g. CVD. Thus the memory cell portion is covered by the two-layered film composed of silicon nitride film 28 and silicon oxide film 29. In the peripheral circuit portion, the two-layered film of silicon nitride film 28 and silicon oxide film 29 is formed further on the insulating film 11 and covers the gate interconnections G2.

Figure 47:
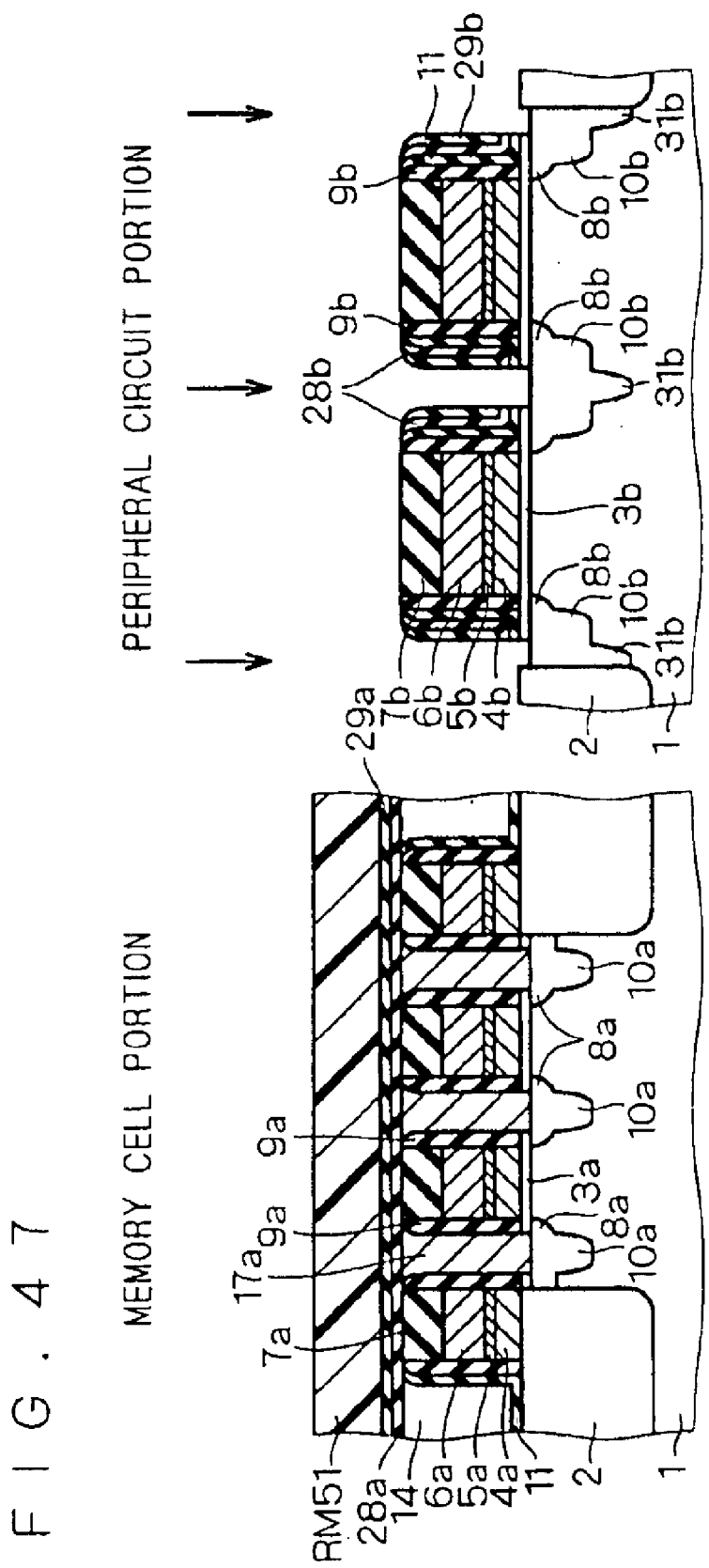

Next, in the process step of FIG. 47, at least the memory cell portion is covered by a resist mask RM51 and a whole-surface etch-back to the silicon oxide film 29 and a whole-surface etch-back to the silicon nitride film 28 are performed using dry-etching, e.g. RIE. Thus, in the peripheral circuit portion, the silicon nitride film 28 and silicon oxide film 29 remain respectively as sidewall nitride films 28b and sidewall oxide films 29b on the outermost side surfaces of the gate interconnections G2.

During this process, the silicon oxide film 29, silicon nitride film 28, insulating film 11, and silicon oxide film 3 on the semiconductor substrate 1 are removed, so that, in the peripheral circuit portion, the surface of the semiconductor substrate 1, i.e. active regions, are exposed.

In the memory cell portion, the silicon nitride film 28 and silicon oxide film 29, protected by resist mask RM51, remain as silicon nitride film 28a arid silicon oxide film 29a.

Subsequently, in the peripheral circuit portion, an impurity ion implantation with a dose of $1 \times 10^{15}$ to $1 \times 10^{16}/cm^2$ is performed to form source/drain regions 31b, using, as implant masks, the gate interconnections G2 having sidewall nitride films 9, insulating films 11, sidewall nitride films 28b, and sidewall oxide films 29b on their sides.

In this process, when N-channel MOS transistors are formed, phosphorus (P) is implanted at an energy of 35 keV to 45 keV, or arsenic (As) is implanted at an energy of 50 keV to 60 keV. When P-channel MOS transistors are formed, boron (B) is implanted at an energy of 5 keV to 10 keV, or boron difluoride ($BF_2$) is implanted at an energy of 20 keV to 30 keV.

This impurity ion implantation may be performed with the silicon oxide film 3, insulating film 11, silicon nitride film 28, and silicon oxide film 29 remaining on the semiconductor substrate 1 in the peripheral circuit portion and then the silicon oxide film 29, silicon nitride film 28, insulating film 11, and silicon oxide film 3 are removed by anisotropic dry-etching.

Next, in the process step of FIG. 48, after removal of the resist mask RM51, metal silicide films 32b are formed on the surface of the semiconductor substrate 1 exposed in the peripheral circuit portion, i.e. on the surfaces of active regions. Since the silicon oxide film 29a lies on top of the memory cell portion, silicide reaction does not take place even when refractory metal is formed thereon and therefore no metal silicide film forms. Refractory metal formed on areas where silicide reaction does not take place, e.g. on silicon oxide film and silicon nitride film, is removed.

Figure 49:
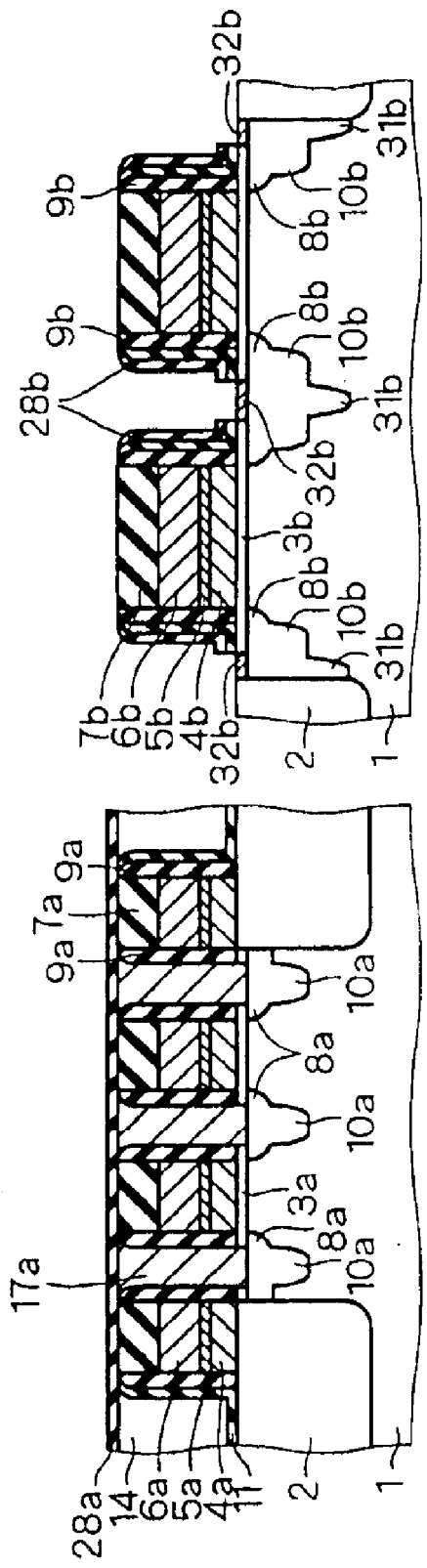

Next, in the process step of FIG. 49, the silicon oxide film 29a covering the memory cell portion and the silicon oxide films 29b on the outermost sides of the gate interconnections G2 in the peripheral circuit portion are removed by wet-etching using a solution, e.g. HF.

This process removes, together with silicon oxide films 29a and 29b, unwanted substances that may have been produced on the silicon oxide film 29 during formation of metal silicide films 32b.

Next, in the process step of FIG. 50, a silicon oxide film, as an interlayer insulating film 18, is deposited all over the semiconductor substrate 1 by, e.g. CVD.

Subsequently, as shown in FIG. 51, a resist mask RM52 is formed, with openings OP51 and OP52 in areas where bit line contacts are to be formed in the memory cell portion and peripheral circuit portion. Then, using the resist mask RM52 as an etch mask, the interlayer insulating film 18 is selectively etched by dry-etching, e.g. RIE, to form contact openings 20a and 20b in the memory cell portion and peripheral circuit portion.

This etching process uses an etching that exhibits a large selectivity with respect to silicon nitride film and silicon film. Thus the contact opening 20a in the memory cell portion is formed to reach contact plug 17a and the contact opening 20b in the peripheral circuit portion is formed to reach metal silicide film 32b on the semiconductor substrate 1.

The contact openings 20a and 20b can be referred to as SAC contacts since they are obtained in a self-aligned manner, which, relaxes resist mask positioning margin for contact formation and thus shortens the manufacturing process.

During this process, in the memory cell portion, since the silicon nitride film 28a lies on top of the memory cell portion, the etching can be stopped in the middle of silicon nitride film 28a. It is therefore possible to remove the silicon nitride film 28a later under different conditions so as to reduce the amount of etch of the protective insulating film 7 formed of, e.g. silicon nitride film, on the gate interconnections G1. This suppresses reduction of short margin between the gate interconnections G1 and bit line contacts formed later.

Next, in the process step of FIG. 52, metal films 24 and 25 are sequentially deposited all over the semiconductor substrate 1; the metal films 24 and 25 fill the contact openings 20a and 20b. Bit line contacts 21a and 21b are thus formed. Then, in order to form a desired bit line pattern, a resist mask patterning process by photolithography and a dry-etching process, e.g. RIE, using the resist mask are carried out to form desired bit lines; thus the main part of the DRAM 600 is completed.

<F-2. Functions and Effects>

In the above-described manufacturing method of the sixth preferred embodiment, the formation of source/drain regions 31b in the peripheral circuit portion described referring to FIG. 47 is performed after the formation of interlayer insulating film 14 described referring to FIG. 6. Therefore, the peripheral circuit portion, after the formation of source/drain regions 31b, does not experience the high-temperature (800° C. to 1000° C.) thermal process performed to improve the burying characteristics during the formation of interlayer insulating film 14.

Also, the formation of source/drain regions 31b in the peripheral circuit portion is performed after the formation of contact plugs 17a described referring to FIG. 10. Therefore, after the formation of source/drain regions 31b, the peripheral circuit portion does not experience the high-temperature (800° C. to 1000° C.) thermal process performed to improve the refresh characteristics after the formation of contact plugs 17a.

Thus the source/drain regions 31b of MOS transistors in the peripheral circuit portion are not affected by high-temperature (800° C. to 1000° C.) thermal treatments, which suppresses reduction of punch-through margin of the MOS transistors in the peripheral circuit portion.

Also, as described referring to FIG. 47, in the peripheral circuit portion, the source/drain regions 31b are formed by impurity ion implantation using as implant masks the gate interconnections G2 having sidewall nitride films 9, insulating films 11, sidewall nitride films 28b, and sidewall oxide films 29a on their sides. Therefore the source/drain regions 31b of MOS transistors in the peripheral circuit portion are formed far away from the gate edges, which ensures still larger punch-through margin.

Moreover, in the peripheral circuit portion, the formation of metal silicide films 32b on the semiconductor substrate 1 not only reduces the contact resistance between bit line contacts 21b and active regions but also reduces the sheet resistance of the active regions, which enhances current driving capability of the peripheral circuit portion.

Furthermore, in the peripheral circuit portion, the contact opening 20b is formed, with the sidewall nitride films 9, insulating films 11, and sidewall nitride films 28b lying on the sides of the gate interconnections G2. Therefore the width of the gate interconnections G2 can be larger to increase the short margin between bit line contacts 21b and gate interconnections G2.

While the invention has been described in detail, the foregoing description is in all aspects illustrative and not restrictive. It is understood that numerous other modifications and variations can be devised without departing from the scope of the invention.

What is claimed is:

1. A semiconductor device comprising a data holding portion and a peripheral circuit portion that operates in association with said data holding portion, said data holding portion and said peripheral circuit portion being formed on a same semiconductor substrate, said semiconductor device comprising:

gate interconnections provided respectively in said data holding portion and said peripheral circuit portion on said semiconductor substrate, each said gate interconnection having a top covered by a silicon nitride film;

first sidewall nitride films provided respectively on sides of said gate interconnections in said data holding portion and said peripheral circuit portion;

first and second impurity regions provided in said data holding portion and said peripheral circuit portion, said respective first and second impurity regions being selectively formed in a surface of said semiconductor substrate that extends outward from sides of said respective gate interconnections;

sidewall insulating films provided on sides of said first sidewall nitride films of said gate interconnection in said peripheral circuit portion;

contact plugs composed of a conductive silicon and passing through a first interlayer insulating film provided on said data holding portion to reach the surface of said semiconductor substrate where said first and second impurity regions are formed;

third impurity regions provided in said peripheral circuit portion, said third impurity regions being selectively formed in a surface of said semiconductor substrate that extends outward from sides of said sidewall insulating films, the third impurity regions having a higher impurity concentration than said first and second impurity regions; and metal suicide films provided on all said contact plugs in said data holding portion and on the surface of said semiconductor substrate in said peripheral circuit portion where said third impurity regions are formed.

2. The semiconductor device according to claim 1, wherein said sidewall insulating films are second sidewall nitride films.

3. The semiconductor device according to claim 1, further comprising:

a second interlayer insulating film provided to cover said peripheral circuit portion and said first interlayer insulating film in said data holding portion; and bit line contacts formed in a self-aligned manner to pass through said second interlayer insulating film on said peripheral circuit portion and on said first interlayer insulating film in said data holding portion to respectively reach said metal silicide films.

4. A semiconductor device comprising a data holding portion and a peripheral circuit portion that operates in association with said data holding portion, said data holding portion and said peripheral circuit portion being formed on a same semiconductor substrate, said semiconductor device comprising:

gate interconnections provided respectively in said data holding portion and said peripheral circuit portion on said semiconductor substrate, each said gate interconnection having a top covered by a silicon nitride film;

first sidewall nitride films provided respectively on sides of said gate interconnections in said data holding portion and said peripheral circuit portion;

first and second impurity regions provided in said data holding portion and said peripheral circuit portion, said respective first and second impurity regions being selectively formed in a surface of said semiconductor substrate that extends outward from sides of said respective gate interconnections;

sidewall insulating films provided on sides of said first sidewall nitride films of said gate interconnection in said peripheral circuit portion;

contact plugs composed of a conductive silicon and passing through a first interlayer insulating film provided on said data holding portion to reach the surface of said semiconductor substrate where said first and second impurity regions are formed;

third impurity regions provided in said peripheral circuit portion, said third impurity regions being selectively formed in a surface of said semiconductor substrate that extends outward from sides of said sidewall insulating films, the third impurity regions having a higher impurity concentration than said first and second impurity regions; and a metal silicide film provided only on the surface of said semiconductor substrate in said peripheral circuit portion where said third impurity regions are formed.

5. The semiconductor device according to claim 4, wherein said sidewall insulating films are second sidewall nitride films.

6. The semiconductor device according to claim 4, further comprising:

a second interlayer insulating film provided to cover said data holding portion and said peripheral circuit portion; and bit line contacts formed in a self-aligned manner to pass through said second interlayer insulating film on said data holding portion and said peripheral circuit portion to respectively reach said contact plugs and said metal silicide film.

* * * * *